United States Patent
Tharmakulasingam et al.

(10) Patent No.: US 12,032,037 B2
(45) Date of Patent: Jul. 9, 2024

(54) APPARATUS AND PROCESS FOR REAL-TIME DETECTION OF HIGH-IMPEDANCE FAULTS IN POWER LINES

(71) Applicant: NewSouth Innovations Pty Limited, Sydney (AU)

(72) Inventors: Sirojan Tharmakulasingam, Sydney (AU); Shibo Lu, Sydney (AU); Bao Toan Phung, Sydney (AU); Eliathamby Ambikairajah, Sydney (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 139 days.

(21) Appl. No.: 17/773,951

(22) PCT Filed: Nov. 6, 2019

(86) PCT No.: PCT/AU2019/051219
§ 371 (c)(1),
(2) Date: May 3, 2022

(87) PCT Pub. No.: WO2021/087543
PCT Pub. Date: May 14, 2021

(65) Prior Publication Data
US 2022/0373612 A1    Nov. 24, 2022

(51) Int. Cl.
*G01R 31/08* (2020.01)
*G01R 31/28* (2006.01)
(Continued)

(52) U.S. Cl.
CPC .......... *G01R 31/52* (2020.01); *G01R 31/085* (2013.01); *G01R 31/2812* (2013.01); *H02H 1/0015* (2013.01)

(58) Field of Classification Search
CPC ................ G01R 31/52; G01R 31/2812; G01R 31/085; H02H 1/0015
(Continued)

(56) References Cited

U.S. PATENT DOCUMENTS

| 5,734,575 A | 3/1998 | Snow et al. |
| 2005/0171647 A1 | 8/2005 | Kunsman et al. |
| 2021/0055357 A1* | 2/2021 | Yeh .......... G01R 31/58 |

OTHER PUBLICATIONS

Sirojan et al. "Sustainable Deep Learning at Grid Edge for Real-Time High Impedance Fault Detection", in IEEE Transactions on Sustainable Computing, published Nov. 7, 2018 (Year: 2018).*

(Continued)

*Primary Examiner* — Alexander Satanovsky
*Assistant Examiner* — Trung Q Nguyen
(74) *Attorney, Agent, or Firm* — MOSER TABOADA

(57) ABSTRACT

Receive analog signal representing real-time electrical current of electrical power transmission/distribution line; sample and digitise analog signal to generate power line current data; generate data frames of subsets of the power line current data for successive overlapping time slices, process data frames to generate frequency domain data representing frequency components for different frequency ranges; process frequency domain data to generate energy data representing average energies of frequency ranges over corresponding time slice; generate two-dimensional feature for machine learning, first dimension represents plurality of the successive time slices, second dimension represents different frequency ranges, values of the two-dimensional feature represent logarithms of corresponding average energies of frequency components of electrical current over corresponding time slices; apply deep learning classifier to two-dimensional feature to detect high-impedance fault in electrical power transmission/distribution line, and if (Continued)

detected: send fault signal to relay or circuit breaker to cut power to the electrical power transmission/distribution line.

17 Claims, 17 Drawing Sheets

(51) Int. Cl.
*G01R 31/52* (2020.01)
*H02H 1/00* (2006.01)

(58) Field of Classification Search
USPC .......................... 324/691, 430, 434, 500, 509
See application file for complete search history.

(56) References Cited

OTHER PUBLICATIONS

S. Ebron et al. "A neural network approach to the detection of incipient faults on power distribution feeders," in IEEE Transactions on Power Delivery 5.2, published 1990, pp. 905-914.
T. Sirojan et al., "Sustainable Deep Learning at Grid Edge for Real-time High Impedance Fault Detection," in IEEE Transactions on Sustainable Computing, published Nov. 7, 2018.
Zhang et al. "Big data analytics in smart grids: a review." Energy informatics (2018) 1:8, published Aug. 13, 2018.
S. Lu et al. "DA-DCGAN: An Effective Methodology for DC Series Arc Fault Diagnosis in Photovoltaic Systems," IEEE Access 7, published Apr. 4, 2019, pp. 45831-45840.
International Search Report for application No. PCT/AU2019/051219, dated Nov. 20, 2019.

\* cited by examiner

APPARATUS AND PROCESS FOR REAL-TIME DETECTION OF HIGH-IMPEDANCE FAULTS IN POWER LINES

TECHNICAL FIELD

The present invention relates to fault detection in electrical power transmission or distribution lines, and in particular to real-time detection of high impedance faults such as may occur when a power line contacts a tree branch or the ground, for example.

BACKGROUND

High impedance fault (HIF) detection on overhead power transmission lines is a challenging problem for electric utility providers. HIFs generally occur when an energized overhead conductor comes into contact with a poorly conductive object such as an over-grown tree branch, or falls onto the ground. The resulting fault current is much lower than the normal load current due to the poor conductivity (high impedance) of the contacting materials, and in particular is insufficient to cause conventional protection relays to trip. Such HIF detection failures or delays can create hazards for living beings as well as severe bushfires and energy losses. Thus there is a general need for rapid detection of HIFs.

It is desired, therefore, to overcome or alleviate one or more difficulties of the prior art, or to at least provide a useful alternative.

SUMMARY

In accordance with some embodiments of the invention, there is provided a process for real-time detection of high-impedance faults in power lines, the process including the steps, performed in real-time, of:
  receiving an analog signal representing a real-time electrical current of an electrical power transmission or distribution line as a function of time;
  sampling and digitising the received analog signal to generate corresponding power line current data representing the electrical current as a function of time;
  processing the power line current data to generate data frames corresponding to respective subsets of the power line current data for respective time slices, and processing each of the data frames to generate corresponding frequency domain data representing frequency components of the electrical current over the corresponding time slice for each of a plurality of respective different frequency ranges;
  processing the frequency domain data to generate energy data representing, for each of the frequency ranges and for each of the time slices, a corresponding average energy of the corresponding frequency components of the electrical current over the corresponding time slice; and
  generating a two-dimensional feature for machine learning, wherein a first dimension of the feature represents a plurality of the time slices, a second dimension of the feature represents the respective different frequency ranges, and each of the values of the two-dimensional feature represents a logarithm of the corresponding average energy of the corresponding frequency components of the electrical current in the corresponding frequency range and over the corresponding time slice;
  applying a deep learning classifier to the two-dimensional feature in order to generate an output to determine whether the two-dimensional feature is indicative of a high-impedance fault in the electrical power transmission or distribution line; and
  if the output of the deep learning classifier is indicative of a high-impedance fault, then sending a fault signal to a corresponding relay or circuit breaker to cause the relay or circuit breaker to cut power to the electrical power transmission or distribution line.

In some embodiments, the step of generating frequency domain data is executed in parallel with the steps of sampling and generating data frames.

In some embodiments, the step of generating frequency domain data and the step of processing the frequency domain data are executed in parallel.

In some embodiments, the received analog signal is sampled at a frequency of at least 20 kHz so that the corresponding frequency domain data represents frequency components up to at least 10 kHz.

In some embodiments, each of the respective different frequency ranges has a corresponding minimum frequency and a corresponding maximum frequency, the maximum frequency being a fixed multiple of the minimum frequency.

In some embodiments, in each of the respective different frequency ranges, the corresponding maximum frequency is about twice the corresponding minimum frequency.

In some embodiments, the subsets of the power line current data are successive but overlapping subsets of the power line current data for successive but overlapping time slices with about sampled 512 data points, and the data frames are generated by applying a Hann function to each of the subsets of the power line current data.

In some embodiments, each successive pair of time slices overlaps by about 50%.

In some embodiments, a first dimension of the feature represents about six successive but overlapping time slices, and a second dimension of the feature represents about eight different frequency ranges.

In some embodiments, the deep learning classifier is a lightweight convolutional neural network (CNN) for classifying high impedance faults in real-time on a resource-constrained edge device, the CNN being configured with the following successive layers:
  a first convolution layer with sliding filters;
  a first batch normalisation layer;
  a first rectified linear unit (ReLU) activation layer;
  a max pooling 2D layer;
  a second convolution layer with sliding filters;
  a second batch normalisation layer;
  a second ReLU activation layer;
  first and second fully connected layers to process feature maps generated by the previous layers; and
  a softmax activation layer to process the fully connected layer output to calculate a probability of the analog signal being indicative of an HIF.

In some embodiments, each convolution layer applies a convolution operation by moving the filters along the layer's input vertically and horizontally by a step size or 'stride' (S), and calculating a dot product of weights (W) and the layer's input (I), and then adding a bias (B) term, according to:

$$O[f][x][y] = \sum_{k=0}^{C-1}\sum_{i=0}^{X-1}\sum_{j=0}^{Y-1} I[k][S*x+i][S*y+j] \times W[f][k][i][j] + B(f)$$

where O, f, C, X and Y respectively denote the output matrix, the number of filter groups in a convolutional layer, the number of channels in the input, the filter height and the filter width.

In some embodiments, each batch normalisation layer normalises its input as mini-batches according to:

$$y_i = \gamma\left(\frac{x_i - \mu_B}{\sqrt{\sigma_B^2 + \varepsilon}}\right) + \beta$$

where xi, μB, σB², γ, and β are input, mini-batch mean, mini-batch variance, scale factor and offset, and ε is introduced to improve numerical stability as mini-batch variance approaches 0.

In some embodiments, the CNN is trained to determine a set of weights using a cross entropy loss function of the form:

$$E(\theta) = -\sum_{i=1}^{n}\sum_{j=1}^{k} t_{ij} \ln y_j(x_i, \theta)$$

where θ is a parameter vector, $t_{ij}$ denotes the $i^{th}$ sample belongs to the $j^{th}$ class, and yj(xi,θ) is the output for the $j^{th}$ sample.

In accordance with some embodiments of the present invention, there is provided at least one non-volatile storage medium having stored thereon FPGA configuration data and/or processor executable instructions that, when executed by at least one processor, cause the at least one processor and/or an FPGA configured in accordance with the FPGA configuration data to execute the steps of any one of the above processes.

In accordance with some embodiments of the present invention, there is provided an apparatus for real-time detection of high-impedance faults in power lines, the apparatus including:
an input to receive an analog signal representing a real-time electrical current of an electrical power transmission or distribution line as a function of time;
a memory component; and
at least one non-volatile memory component storing FPGA configuration data to configure the FPGA;
a field-programmable gate array (FPGA) component that, when configured in accordance with the configuration data, causes the FPGA to:
sample and digitise the received analog signal to generate corresponding power line current data representing the electrical current as a function of time;
select successive subsets of the power line current data; and
processing the power line current data to generate data frames representing successive subsets of the power line current data for respective successive time slices, and processing each of the data frames to generate corresponding frequency domain data representing frequency components of the electrical current over the corresponding time slice for each of a plurality of respective different frequency ranges;
wherein the non-volatile memory component stores processor-executable instructions that, when executed by the microprocessor cause it to:
process the frequency domain data to generate energy data representing, for each of the frequency ranges and for each of the time slices, a corresponding average energy of the corresponding frequency components of the electrical current over the corresponding time slice; and
generate a two-dimensional feature for machine learning, wherein a first dimension of the feature represents a plurality of the time slices, a second dimension of the feature represents the respective different frequency ranges, and each of the values of the two-dimensional feature represents a logarithm of the corresponding average energy of the corresponding frequency components of the electrical current in the corresponding frequency range and over the corresponding time slices; and
apply a deep learning classifier to the two-dimensional feature in order to generate an output to determine whether the two-dimensional feature is indicative of a high-impedance fault in the electrical power transmission or distribution line; and
if the output of the deep learning classifier is indicative of a high-impedance fault, then send a fault signal to a corresponding relay or circuit breaker to cause the relay or circuit breaker to cut power to the electrical power transmission or distribution line.

In some embodiments, the FPGA is configured such that the steps of sampling and selecting are executed by a first slice of the FPGA, and the step of generating frequency domain data is performed by a second slice of the FPGA different to the first slice, the first and second slices operating concurrently.

In some embodiments, the FPGA and microprocessor are configured for pipelined parallel execution of the steps of generating frequency domain data and processing the frequency domain data.

In some embodiments, the apparatus is in the form of an embedded device attached to a power line support pole and operating as an edge computing device.

BRIEF DESCRIPTION OF THE DRAWINGS

Some embodiments of the present invention are hereinafter described, by way of example only, with reference to the accompanying drawings, wherein.

DETAILED DESCRIPTION

High impedance faults (HIFs) appear at the primary side of the power distribution network, and it is estimated that 5-10% of faults in the distribution network are HIFs. For example, five of the fifteen most destructive fires in the 'Black Saturday' fires in Victoria, Australia in 2009 were caused by HIFs. An HIF occurs when a live overhead conductor touches the ground below indirectly via a poorly conducting object such as a tree, and when there is a fallen energized overhead conductor that directly contacts the ground. HIFs are common in medium voltage networks, and are challenging to detect by conventional protective relays because they do not draw a fault current large enough to trip the protection relays. For example, the magnitude of the high impedance fault current can be less than one-tenth of the normal load current. Even though this appears to be harmless to the power networks, detecting HIFs is important because broken energized conductors can cause severe threats to living beings, the harmonics injected into the grid due to the fault condition can affect the power quality, and HIFs can cause bushfires due to the high temperature of the contact surface heated by sustained arcing.

Figure 1:
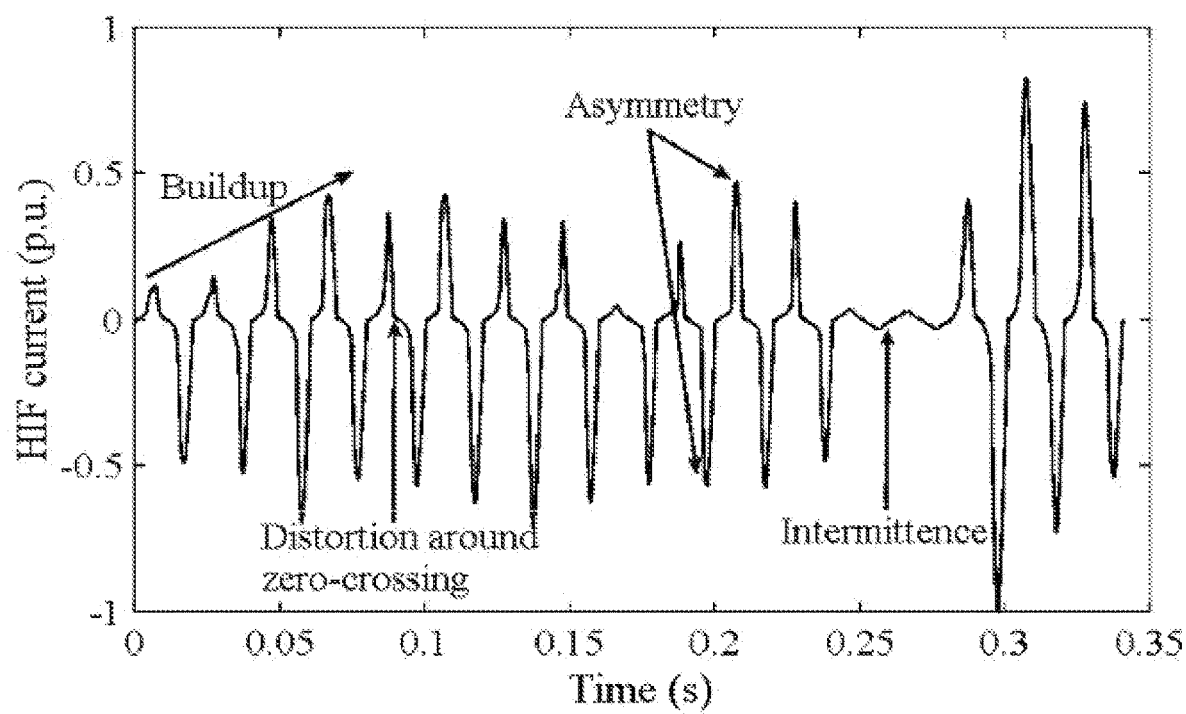
FIG. 1 is a graph illustrating characteristics of a typical waveform of electrical current in a power line resulting from a high-impedance fault (HIF)

An example of a HIF fault current waveform generated is shown in FIG. 1. It shows the general characteristics of HIF current, including asymmetry, randomness, build-up, intermittency, and distortion around the zero-crossing point. These properties of the fault signal can be exploited to derive a unique signature of HIFs.

Figure 2:
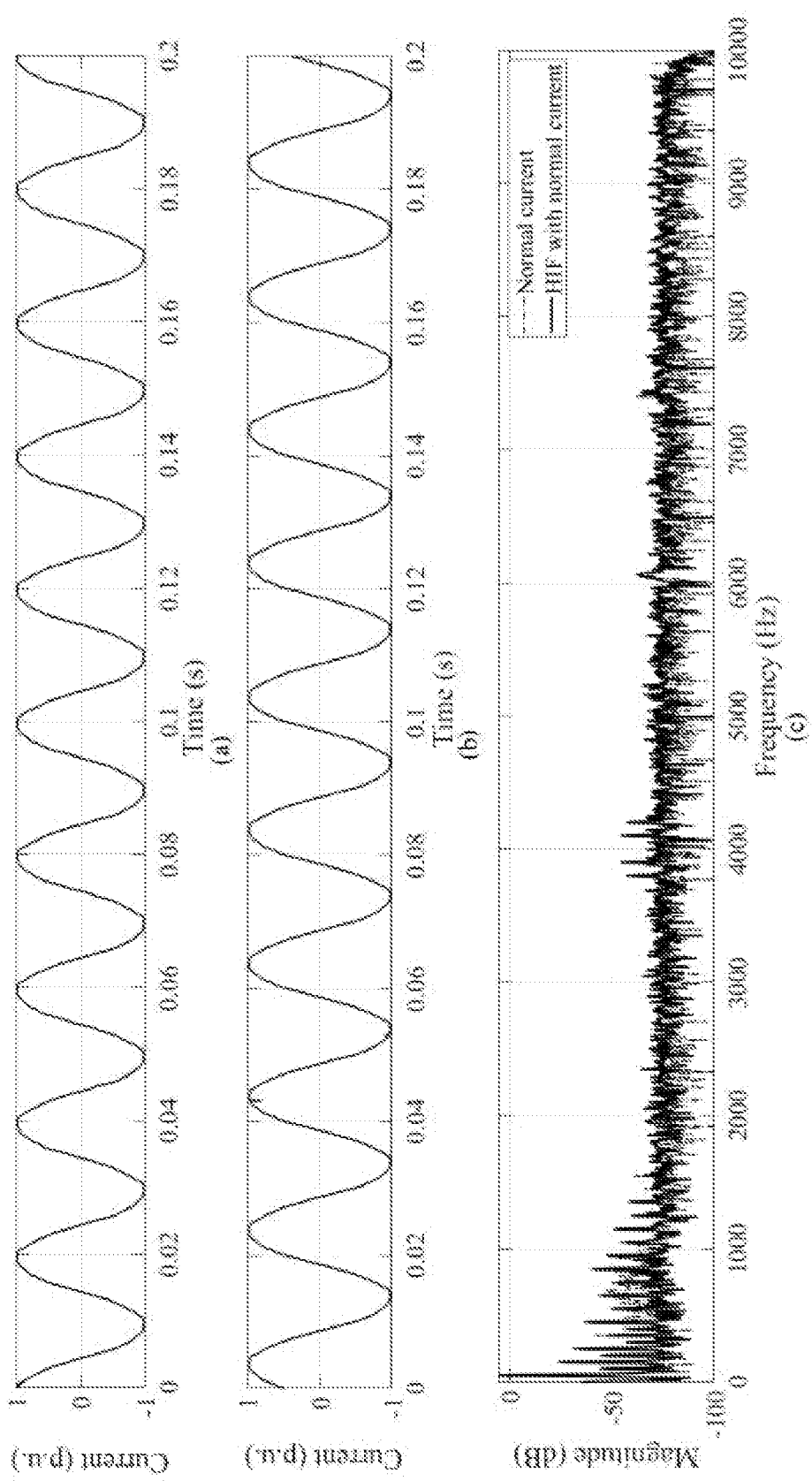
FIG. 2 provides a comparison of total power line electrical current in the time and frequency domains during normal operation and operation in the presence of a simulated HIF, specifically: (a) normal operation current waveform; (b) HIF current combined with normal current; (c) frequency domain spectra of total electric current with and without the simulated HIF.

The HIF current is very small compared to the normal current (a few amps to some tens of amps, as opposed to hundreds of amps). As shown in FIGS. 2 (a) and 2 (b), the HIF features are therefore hidden in the large normal load current in the time domain. However, in the frequency domain, as shown in FIG. 2 (c), it can be seen that the noise intensity increases after an arc fault occurs, and this can be exploited for HIF detection. In contrast to HIF detection based on low-frequency contents in the current (e.g., 2nd, 3rd, 5th harmonics), the high-frequency components capture the sudden changes and intermittent variations of electric current caused by the HIF event. In particular, the high-frequency components offer more information to identify the unique characteristics and patterns of HIFs so that they can be discriminated from other disturbances in the distribution network such as capacitor bank switching, magnetizing inrush, and load switching, for example.

The time delay in HIF detection is critical because HIFs can start fires quickly, and consequently protection systems with long detection and response times are not able to decrease the risk of such fires. For example, in the case of a 'wire on ground' HIF and soil as the contact material, it has been reported the time to ignite is around 200 milliseconds for HIF currents from 1 to 10 amps. Consequently, this fire risk can be reduced if the protection response time (i.e., the time from the fault occurrence to cutting power to the corresponding power line) is less than 200 milliseconds. According to the findings in 'Vegetation Conduction Ignition Test' report (T. Marxsen, Dept. Econ. Develop. Jobs Transport Resour., Marxsen Consulting Pty Ltd., Sydney, Australia, 2015), a significant fire risk reduction can be achieved by responding within 5 seconds for 'branch across wires' faults. In addition, if the protection system can detect and clear the 'branch touching wires' earth faults with 0.5 A sensitivity within 2 seconds, fire risk will be reduced dramatically. Therefore, the average latency of HIF detection should be only a fraction of a second or less to decrease such risks (e.g., fewer than 10 power cycles).

Figure 3:
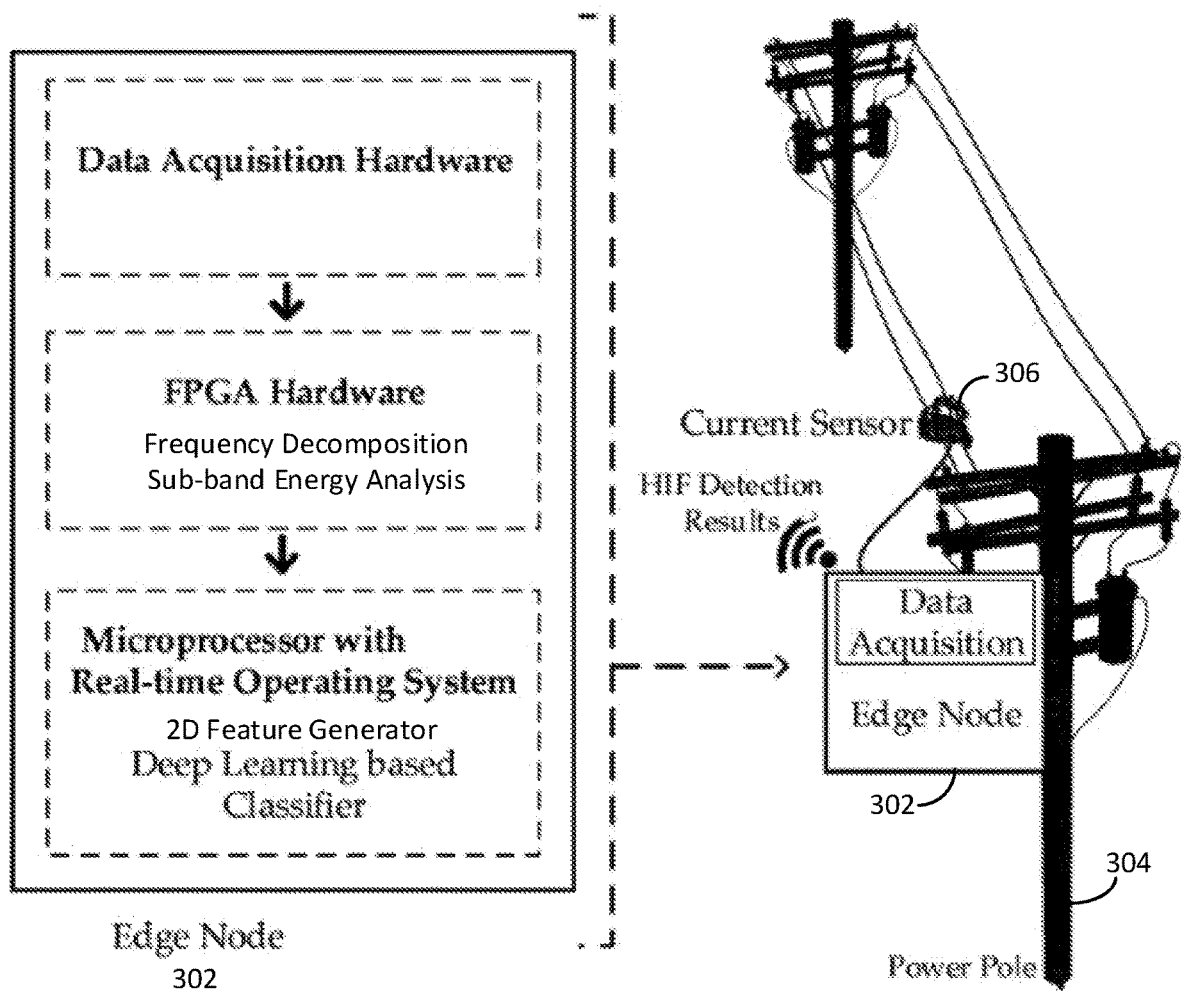
FIG. 3 is a schematic diagram illustrating an HIF detection apparatus in accordance with an embodiment of the present invention, operating as an edge node and mounted on a power pole, and showing the major functional components of the HIF detection apparatus.

Embodiments of the present invention include an apparatus and process for real-time detection of high-impedance faults in power lines (also referred to herein for convenience as the HIF detection apparatus and process) that can satisfy the requirements described above. FIG. 3 illustrates an embodiment of the apparatus in the form of a self-contained computing node 302 coupled to a power line 304 via a current sensor 306 and coupled to a communications network via a wireless interface of the computing node 302, allowing the apparatus to cause a remote network protection device such as a smart relay or a circuit breaker to cut power to the affected power line 304 upon detection of a high-impedance fault.

The described embodiments of the apparatus are examples of a technology known in the art as "edge computing". Edge computing is an emergent computing architecture that brings data analytics, communication, control, and storage closer to the point of sensing. In the context of the present application, this enables embedded Artificial Intelligence (AI) applications with millisecond reaction times. Even though edge computing is characterized by relatively low network latency, there is typically a considerable processing delay due to the limited computing power of edge devices. Consequently, resource-hungry computations are not generally suitable for edge deployment. Since HIF detection requires time-sensitive data processing, it can be deployed at the edge, but its computation steps need to be carefully designed according to the computational capabilities of the edge device hardware.

To avoid additional cost for installing extra measuring devices, a traditional metering/protection current transformer (CT) can be utilized as the current sensor 306. Although such CTs are designed to operate at the mains power frequency (50 Hz in Australia), the inventors have determined that they are nevertheless capable of measuring high-frequency components (up to at least 10 kHz) with acceptable accuracy for high impedance fault detection.

As shown in FIG. 3, in the described embodiment the apparatus/edge node 302 is mounted at the top of a power pole 304 to process the electrical current measurement signals generated by the current sensor (7 gigabytes of data in a day) 306 and to detect high-impedance fault conditions within 10 power cycles (200 milliseconds) to reduce the risk of severe fire hazards. In the described embodiment, the apparatus 302 is implemented as a portable reconfigurable embedded device, specifically a National Instruments myRIO-1900. A simplified block diagram of the hardware components of this device is shown in FIG. 4, and FIG. 5 shows a block diagram of the software components stored in non-volatile memory of the embedded device.

Figure 4:
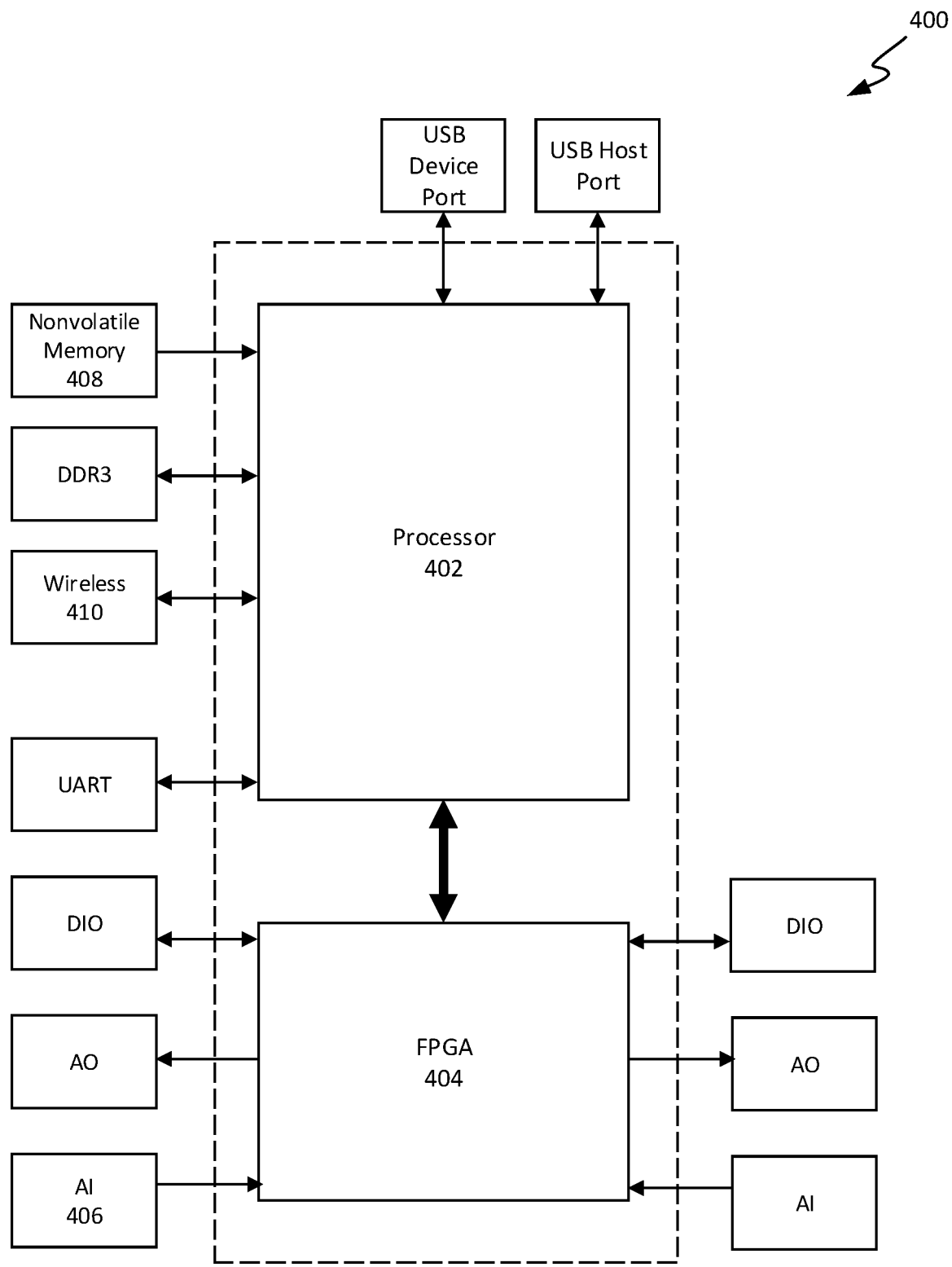
FIG. 4 is a block diagram showing hardware components of the HIF detection apparatus in accordance with an embodiment of the present invention.
Figure 5:
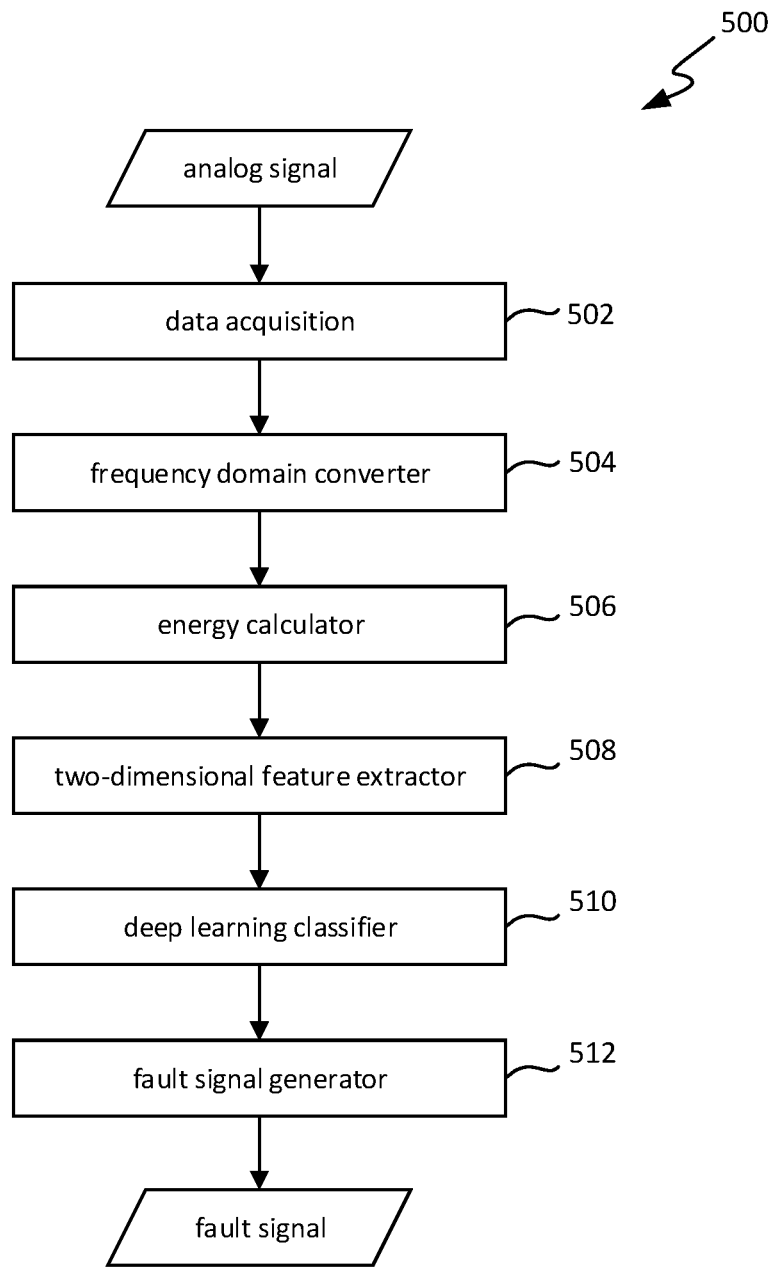
FIG. 5 is a block diagram showing software components of the HIF detection apparatus in accordance with an embodiment of the present invention.
Figure 6:
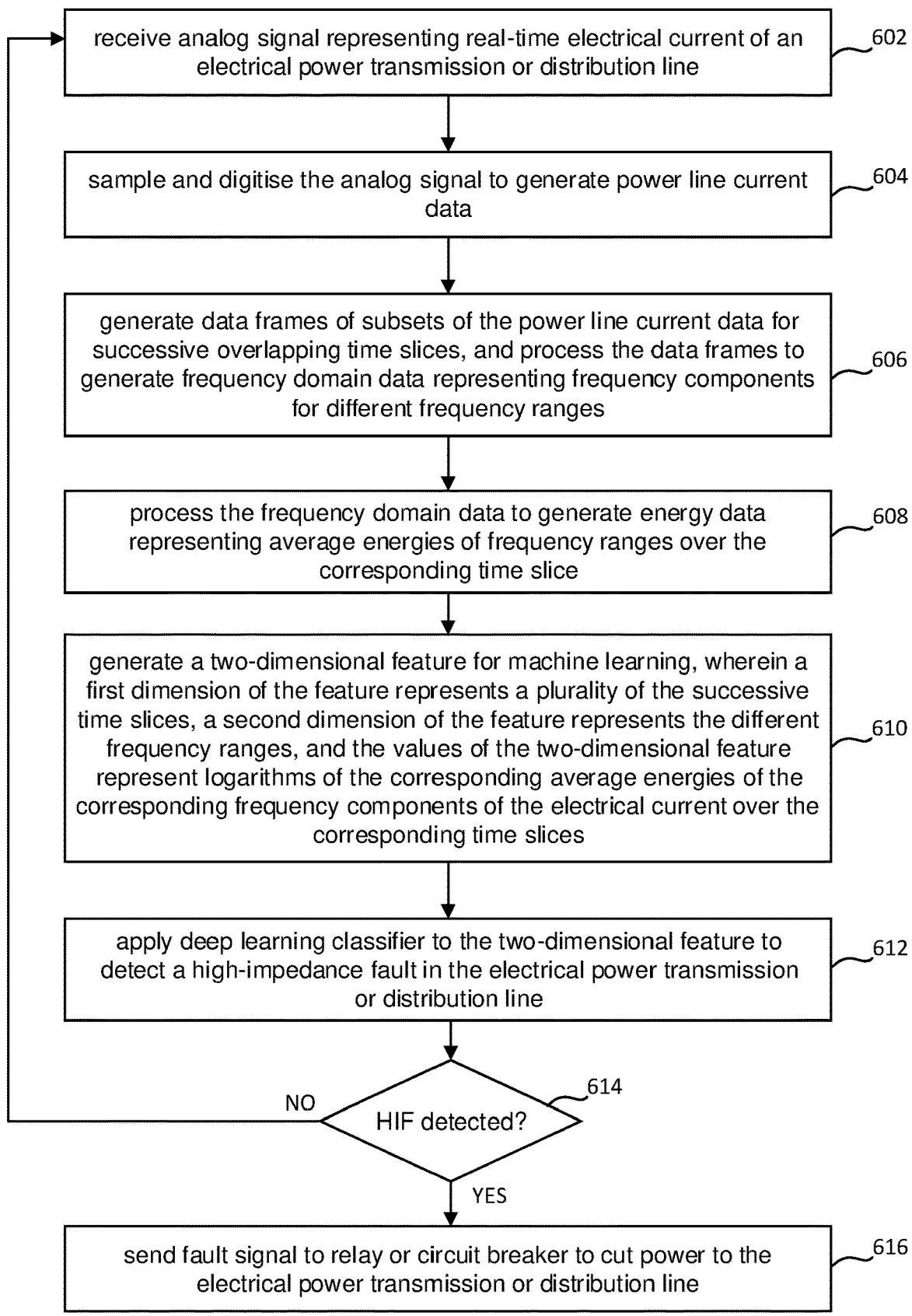
FIG. 6 is a flow diagram of an HIF detection process in accordance with an embodiment of the present invention.

As shown in FIG. 4, the hardware components of the apparatus include a microprocessor 402 and a field-programmable gate array or 'FPGA' 404. The FPGA 404 includes an analog input 406 for receiving an analog signal representing the electrical current flowing in a power line, as measured by the current sensor 306. The HIF detection apparatus executes an HIF detection process which in the described embodiments is implemented in the form of software components stored in non-volatile memory 408 of the apparatus. A wireless communications interface 410 allows the apparatus to transmit a HIF detection or 'fault' signal to remote systems in order to cause those systems to cut power to the power line experiencing the HIF.

The software components of the apparatus include FPGA software components 502 to 506 in the form of configuration data for the FPGA 404 of the embedded system of FIG. 4, and processor components 508 to 512 for execution by the microprocessor 402 of the embedded system of FIG. 4. The FPGA software components 502 to 506 include a data acquisition component 502, a frequency domain converter 504, and an average energy calculator 506. The processor components 508 to 512 include a two-dimensional feature generator, a deep learning classifier 510, and a fault signal generator 512.

At a high level, the embedded device includes three main hardware components: data acquisition (DAQ) hardware, Field Programmable Gate Arrays (FPGA), and a Microprocessor executing a real-time operating system 514. The DAQ includes analog input channels with analog-to-digital converters whose signal sampling rate is set to 20 kHz to capture frequency components of the measured current up to 10 kHz for fault detection (noting also that higher sampling rates could not be handled by the microprocessor). In order to process the sampled data with sufficient speed and low latency, the acquired signal needs to be processed by dedicated hardware. FPGAs are well suited to process the data from high-speed DAQ systems. In the described embodiment, the embedded device has multi-channel analog-to-digital converters (ADCs) and a Xilinx Z-7010 type FPGA which accommodates 80 digital signal processor slices (DSPs), 60 blocks of random access memory (RAM), slice registers and look-up tables that can be used for high-speed signal processing. In addition to the FPGA hardware 404, the edge node includes a 2-core 667 MHz ARM microprocessor 402 with a Linux-based real-time operating system (OS).

The high level dataflow in the edge node can be summarised as follows: an ADC component of the edge device samples the current signal at a sampling frequency of 20 kHz; the resulting digital representation of the acquired signal is then transferred to the FPGA hardware 404 for pre-processing and extraction of features relevant to HIF detection; the extracted features are then transferred to the microprocessor 402 for fault identification using a deep learning based classifier; and finally if the fault identification results identify a fault, then a fault signal is sent to a remote smart relay or a circuit breaker to isolate the faulty feeders and thus cut power to the line experiencing the fault. Among the high level data processing steps described above, the feature extraction and fault identification steps are highly computationally intensive, and consequently need to be optimized in accordance with the computational capabilities of the edge device hardware.

Feature Extraction

The feature extraction process can be summarised as the transformation of the raw input signal data into properties that are distinctive of high impedance faults. In the described embodiments, the raw analog input signal is first denoised using an analog low pass filter with a cutoff frequency of 10 kHz, and is then sampled at a frequency of 20 kHz so that the fault signature extraction can include high-frequency components up to 10 kHz. (According to the Nyquist sampling theorem, the sampling rate must be at least twice the highest frequency component of interest in the measured signal to avoid aliasing.) Once the digitised raw signal is acquired, a Fast Fourier Transformation (FFT) is applied to the pre-processed signal.

The Fourier transformation converts the digitised signal from the time domain to the frequency domain. Since the digitised signal is a discrete signal, a Discrete Fourier Transformation (DFT) is applied to determine its frequency components. Specifically, the DFT transforms a frame of discrete time sequence, xn=[x[0], x[1], . . . , x[n]] into a corresponding frequency domain sequence, xb=[X(0), X(1), . . . , X(N−1)], where X(b) represents the magnitude of the bth frequency component, which is determined according to:

$$X(b) = \frac{N}{2} \left| \sum_{n=0}^{N-1} x[n] \cdot e^{-j2\pi bn/N} \right| \qquad (1)$$

where N is the number of samples per frame. The computation of the N point DFT requires $O(N^2)$ arithmetic operations. To reduce this computational complexity, a Short Time Fourier Transform (STFT) is used to calculate the same DFT, but in only $O(N \log N)$ operations. An STFT based feature can be efficiently extracted by applying an FFT algorithm to short time framed discrete signals, as described below.

Embodiments of the present invention use a two-dimensional ("2D") feature for HIF detection based on a short time FFT and can be extracted by an edge device in real-time. First, the time domain signal data is framed using a Hann window function to minimize the discontinuities of truncated waveforms when the data is framed as finite-length data. While smoothing out the discontinuities, the Hann window function attenuates the sample points at the edges of the framed signal to reduce spectral leakage. However, this can mask the features near both ends in a frame. To mitigate this, in the described embodiments the Hann window function is applied to the time-domain data samples with 50% overlapping.

Figure 7:
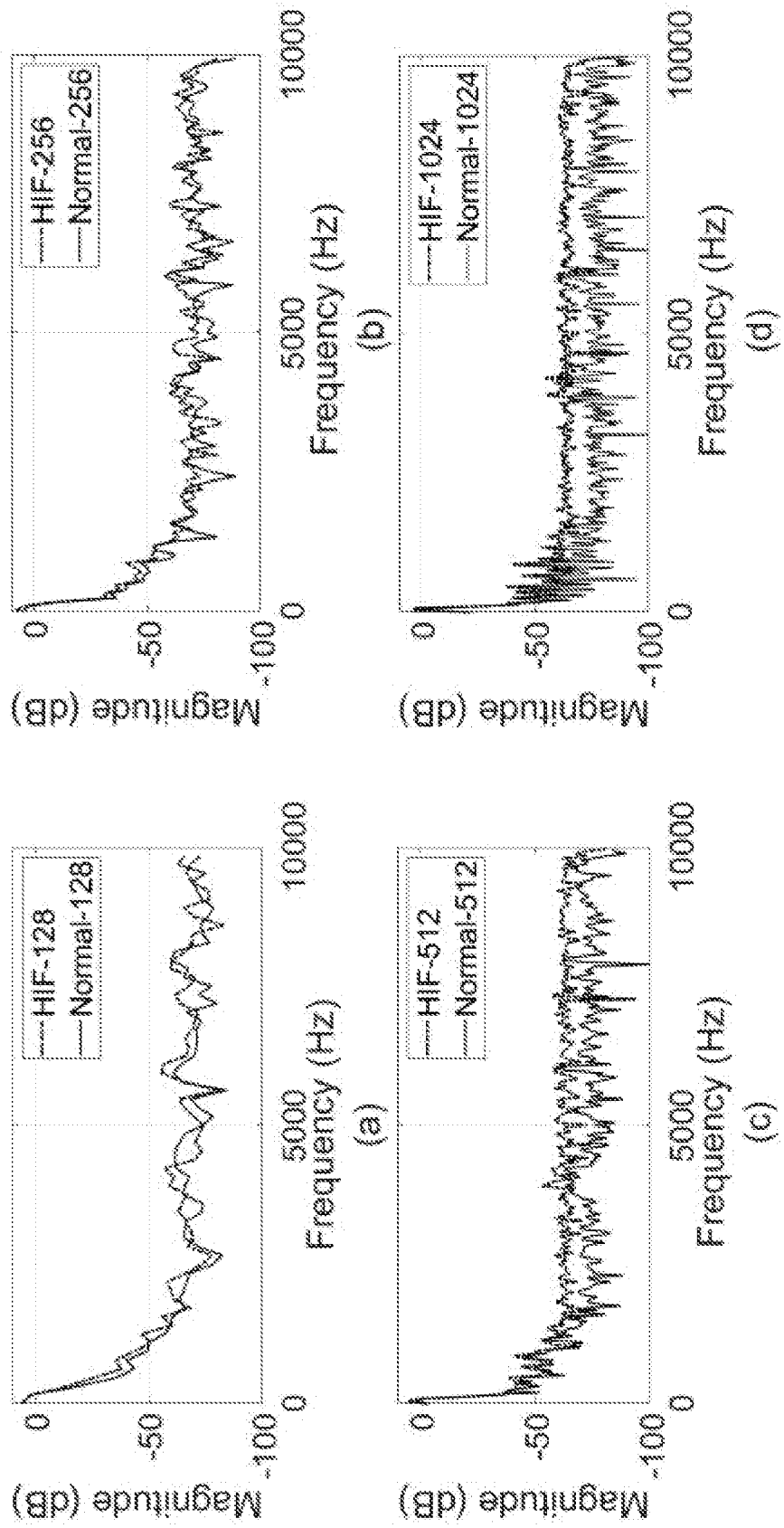
FIG. 7 compares frequency spectra of normal and (normal+HIF) electric current generated from data frames with different numbers of sampled points, as follows: (a) 128 points; (b) 256 points; (c) 512 points; and (d) 1024 points.
Figure 8:
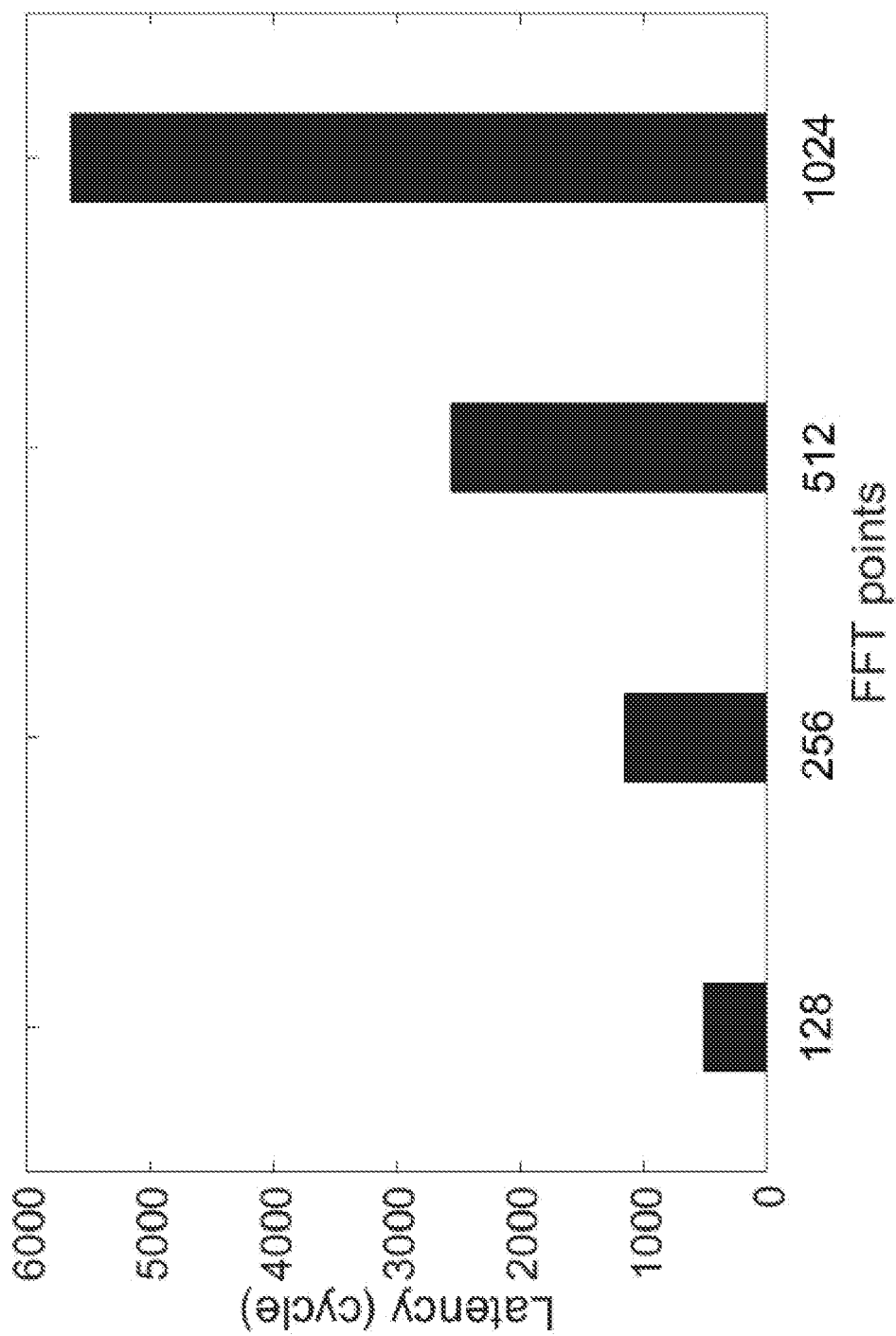
FIG. 8 is a bar chart of latency as a function of the number of points in each data frame.

The Hann window function can be expressed as follows:

$$Hann(j) = \frac{1}{2} - \frac{1}{2} \cos\left(\frac{2\pi j}{N}\right) \quad (2)$$

where N is the number of sample points in a frame. The resulting framed signal is provided as input to the FFT component to compute the frequency components of the signal. Higher frequency components can be determined when the number of points (N) in a frame is increased, and consequently the FFT component provides more accurate results for higher values of N. As shown in FIGS. 7(a) and 7(b), the frequency spectra of normal current and current affected by a HIF (referred to hereinafter for convenience as "HIF current" notwithstanding that it actually includes both the normal current and current from the HIF itself) are very similar for N=128 and N=256. In contrast, HIF events can be clearly discriminated from normal operating conditions when N=512, and there is almost no improvement when further increasing N to 1024, as shown in FIGS. 7(c) and 7(d). However, increasing N increases the computational complexity (according to N log 1V) as well as the latency. FIG. 8 is a barchart of latency as a function of N for values of N from 128 to 1024. Since HIF detection is a time-sensitive application, using N=512 achieves a good balance between accuracy, latency, and computational complexity.

Figure 9:
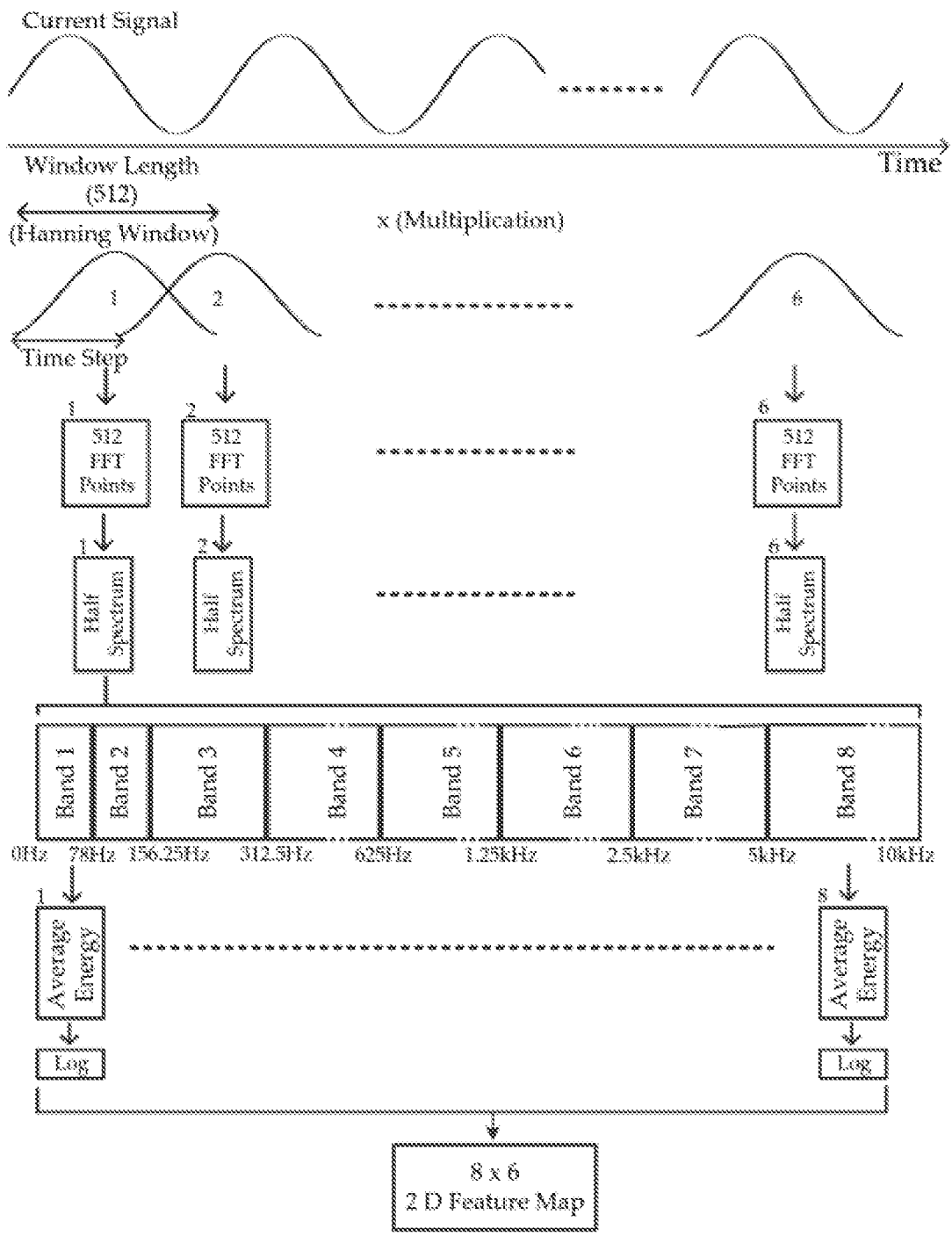
FIG. 9 is a schematic diagram illustrating the various stages of processing electrical current measurements to generate a two-dimensional ("2D") feature for use in deep learning to detect HIFs from electrical current measurements.

FIG. 9 is a schematic representation of the feature extraction process. A frame with 512 sample points corresponds to 1.28 cycles (25.6 ms) of a 50 Hz current signal. As described above, the alternating current flowing in a power line subject to a high-impedance fault is intermittent and has distinctive characteristics in each cycle. Accordingly, the frequency components are processed cycle-by-cycle to extract the characteristic features during a high-impedance fault. In the described embodiments, the FFT computes 512 symmetric frequency points ranging from 0-$2\pi$ rad for each framed signal portion. The calculated frequency points are symmetric such that the first 256 FFT points correspond to the frequency range from 0 Hz-10 kHz. Then the whole frequency range is divided into specific ranges of frequencies referred to as frequency bands, this process being referred to as sub-band decomposition. In the described embodiments, an octave scale is used to decompose the frequencies such that the upper band frequency is twice the lower band frequency for all but the lowest band (where the minimum frequency is 0 Hz).

Table 1 below summarizes the frequency band decomposition used in the described embodiments, along with the corresponding harmonics information. Octave scale decomposition is chosen to yield more selectivity (narrow bandwidth) to the lower order harmonics since they have exhibited more fluctuations. On the other hand, higher order harmonics demonstrated consistent divergence of HIFs from normal operation, and consequently larger bandwidths (less selective bands) are suitable for capturing consistent patterns in higher order harmonics. After the decomposition of frequencies, the average energy is calculated for each frequency bands. Thereafter, a feature vector (an 8×1 vector in the described embodiments) is generated by applying a logarithmic transformation to the average energies in each of the eight frequency bands. The logarithmic transformation is applied to enhance the visibility of patterns in the calculated energy values.

TABLE 1

HARMONICS INFORMATION OF FEATURE VECTOR

| Frequency Band | Harmonics Information |
|---|---|
| Band 1 (0 Hz-78 Hz) | Fundamental component |
| Band 2 (78 Hz-156 Hz) | $2^{nd}$ & $3^{rd}$ Harmonics |
| Band 3 (156 Hz-312 Hz) | $4^{th}$, $5^{th}$ & $6^{th}$ Harmonics |
| Band 4 (312 Hz-625 Hz) | $7^{th}$-$12^{th}$ Harmonics |
| Band 5 (625 Hz-1.25 kHz) | $13^{th}$-$25^{th}$ Harmonics |
| Band 6 (1.25 kHz-2.5 kHz) | $26^{th}$-$50^{th}$ Harmonics |
| Band 7 (2.5 kHz-5 kHz) | $51^{st}$-$100^{th}$ Harmonics |
| Band 8 (5 kHz-10 kHz) | $101^{st}$-$200^{th}$ Harmonics |

A key point to note during the feature extraction process is that the extracted feature should be capable of detecting faults while also being immune to false positive results. Since the fault current characteristics include intermittency and random variations, the extracted feature ideally needs to be reliable in the sense that it should not give rise to false positives. To improve the reliability of the extracted feature, six adjacent frames are combined to generate a 2D feature that is used for deep learning. Based on that, 4.5 consecutive current waveform cycles are taken into consideration in the 2D feature to capture the current properties of HIFs, including asymmetry, intermittency, and buildup. The 2D feature of the described embodiments consists of a two-dimensional matrix of 8×6=48 values of frequency band average energy for a first dimension of eight frequency bands, and a second dimension of six successive frames, and these 2D features are used to detect HIFs in real-time. FIG. 9 includes four graphical representations of these 2D features referred to herein as 2D feature "maps", for different power line current signals corresponding to: (a) normal operation, and operation affected by an HIF caused by power line contact with: (b) a tree branch, (c) ground sand, and (d) ground soil. While the variations in the higher frequency bands are clearly observable (towards the upper portion of each map), there is not much apparent difference between the lower band levels of the HIF and normal operation maps. The ability to discriminate between 2D features for HIF and normal operation is further enhanced by applying the deep learning based classifier to detect HIF conditions in real-time and with higher accuracy.

Fault identification is the final computational step in HIF detection, and is achieved by computing the probability of a fault condition using statistical and machine learning models. In the described embodiments, HIF identification is a binary class classification problem comprising two classes: "HIF" and "Healthy"/"normal". In the described HIF detection apparatus and process, a deep learning based classifier is used to detect HIFs in real-time.

As known by those skilled in the art, deep learning is a subset of machine learning in Artificial Intelligence which can imitate functionalities of a human brain to detect patterns and decision making. A primary drawback with traditional machine learning techniques is that the prediction accuracy heavily depends on the specific input feature chosen for classification. Traditional machine learning approaches rely on hand engineered feature extraction techniques, but these hand-crafted feature extractions are time-consuming and error-prone, and it is extremely difficult to find an optimal feature set. In contrast, deep learning can automatically determine the features from the input data. Deep learning, also known as deep neural networks, provides a series of neuron layers. There are different types of deep learning layers, including fully connected layers, convolutional layers, pooling layers, normalization layers, and activation layers. Different deep learning techniques use different combinations of layer types selected from these types. The input data is processed in these layers, and the output of each layer is forwarded to the successive layer in the series.

In deep neural networks ("DNNs"), the layers near the input data are referred to as the lower layers, while others are referred to as the higher layers. Typically, lower layers are responsible for fine-tuned feature extraction, whereas higher layers are used for decision making based on the fine-tuned features. DNNs can have any of a wide variety of architectures and sizes depending on application. Popular architectures such as Recurrent Neural Networks (RNN), fully connected networks and Convolutional Neural Networks (CNNs) are also evolving rapidly to improve domain-specific accuracy and efficiency.

Figure 10:
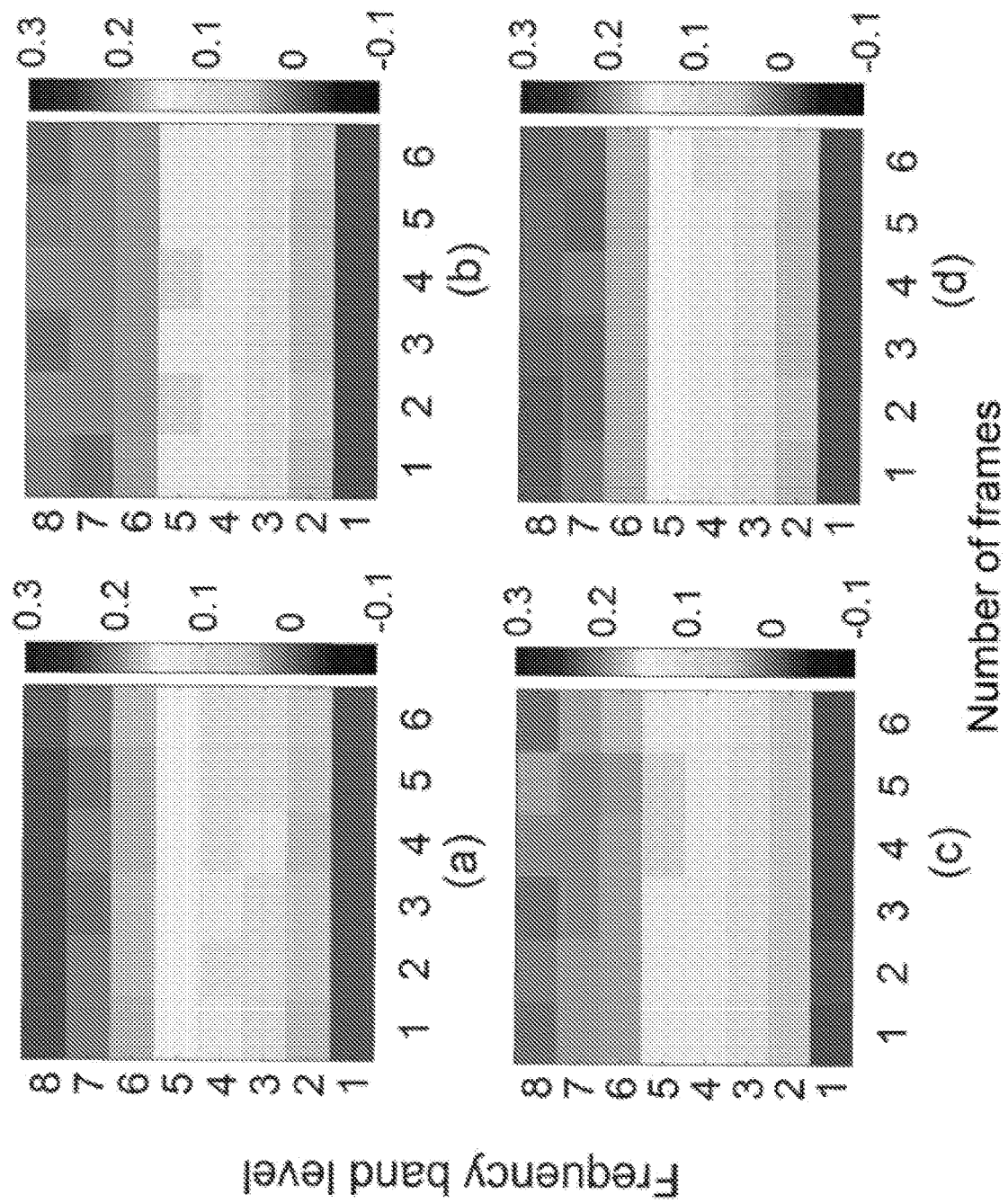
FIG. 10 is a set of four 2D feature maps corresponding to: (a) normal current, and (b-d) current affected by HIFs resulting from contact of a power line with: (b) a tree branch, (c) sand, and (d) soil.

In the described embodiments, the deep learning classifier 510 has a light-weight CNN architecture to classify HIFs in real-time at resource-constrained edge devices. FIG. 10 is a block diagram representing the internal structure of the CNN deep learning classifier 510 of the described embodiments. The extracted 2D feature is provided to an input layer 1102 of the CNN deep learning classifier 510. From the input layer it is forwarded to a first convolutional layer 1104 which in the described embodiment contains 4 filters of size 2×2 to extract higher level features from the input. During development of the described embodiment, several combinations of convolutional filters were tested based on domain-specific intuitions and their computational complexities, and FIG. 10 plots some of the results in terms of latency and accuracy. The convolutional layer 1104 is structured to perform the computations as convolutions with sliding filters that can only cover a small neighbourhood of input activations. The convolution operation is accomplished by moving the filters along the layer's input vertically and horizontally (i.e., along the two dimensions of the 2D feature) by a step size or 'stride' (S), and calculating the dot product of the weights (W) and the input (I), and then adding a bias (B) term, according to:

$$O[f][x][y] = \sum_{k=0}^{C-1}\sum_{i=0}^{X-1}\sum_{j=0}^{Y-1} I[k][S*x+i][S*y+j] \times W[f][k][i][j] + B(f) \quad (3)$$

where θ, f, C, X and Y respectively denote the output matrix, the number of filter groups in a convolutional layer, the number of channels in the input, the filter height and the filter width. A filter group in a convolution layer contains a stack of 2D filters to process different channels in the input. But the feature map of the described embodiment contains only one channel (1×8×6).

The output from the first convolutional layer 1104 is forwarded to a batch normalization layer 1106 that normalizes each input channel as mini-batches. The computation of a batch normalization is as follows:

$$y_i = \gamma\left(\frac{x_i - \mu_B}{\sqrt{\sigma_B^2 + \varepsilon}}\right) + \beta \quad (4)$$

where $x_i$, $\mu_B$, $\sigma_B^2$, $\gamma$, and $\beta$ are input, mini-batch mean, mini-batch variance, scale factor and offset. $\varepsilon$ is introduced to improve the numerical stability when mini-batch variance is relatively small (closer to 0).

Initially, the normalization layer 1106 transforms its input to a mapping with zero mean and unit variance. Then it shifts and scales that mapping with the learnable parameters ($\gamma$, $\beta$) to make it optimal for the successive layers of the CNN. The output from batch normalization 1106 is forwarded through a threshold operation using Rectified Linear Unit (ReLU) activation layer 1108 (which replaces values less than zero with a zero value). The reason for placing normalization layers and non-linear activations between convolutional layers is to improve network stability and learning speed. Following the nonlinear activation, the 2D feature map is down-sampled by a 2D max-pooling layer 1110. Down-sampling is performed by dividing the (6×8) feature map into 2×2 pooling regions and extracting the maximum value of each 2×2 pooling region. The max-pooling operation makes the learning process robust and invariant to minor fluctuations and distortions in the input signal. In addition, it reduces the dimensionality of the feature map and thus reduces the computational costs of the successive layers.

Figure 11:
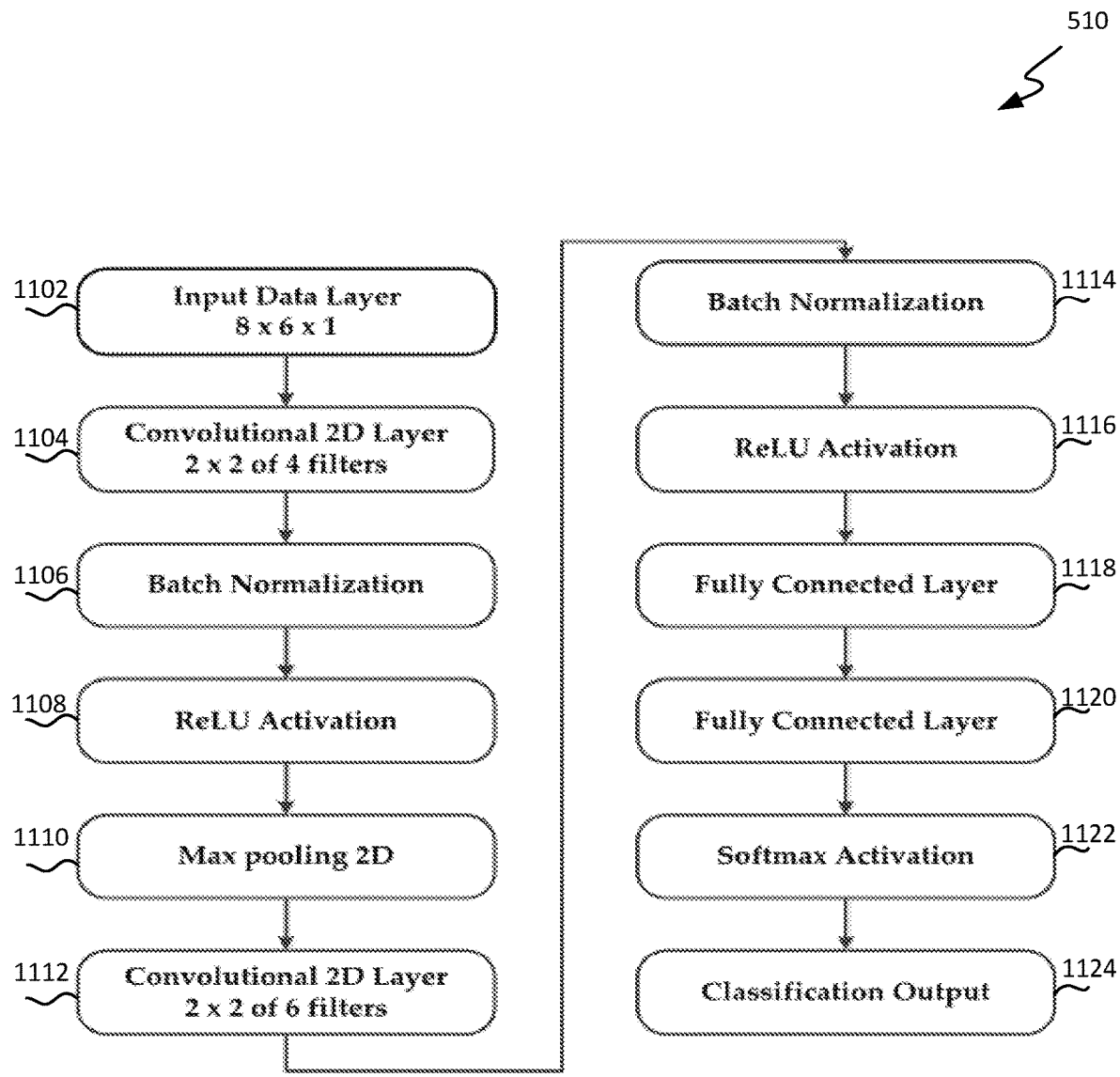
FIG. 11 is a block diagram illustrating the layer architecture of a convolutional neural network (CNN) of the described apparatus and process in accordance with an embodiment of the present invention.

Then, the reduced 2D feature is forwarded to a 2nd convolutional layer 1112, which in the described embodiment contains 6 filter groups such that each group is a stack of 4 filters to process the 4 channels produced by the 1st convolutional layer 1104. The convolution output in each filter groups are summed across all 4 channels. As shown in FIG. 11, in the described embodiments this combination provides a good balance between latency and accuracy. After convolution, the output feature map is normalized by the batch normalization layer 1114 and sent through the ReLU activation 1116. This series of convolutions and nonlinear activations produces more higher-level feature maps. Then those feature maps are forwarded to the fully connected layers 1118, 1120 for classification. Each fully connected layer 1118, 1120 multiplies the flatten higher level feature map by a weight matrix and then adds a bias vector. A softmax activation function 1122 is applied to the fully connected layer output to calculate the probability of an HIF. Mathematically, the softmax function is as follows:

$$y_r(x) = \frac{e^{x_r}}{\sum_{j=1}^{k} e^{x_j}} \quad (5)$$

where x is a vector of inputs from the last fully connected layer, and k represents the number of output classes. The classification results 1124 are determined by the probabilities of the output classes.

The deviation between the actual scores and the scores predicted by the CNN 510 is defined as loss. In the described embodiments, a cross entropy function is used to calculate the loss according to:

$$E(\theta) = -\sum_{i=1}^{n}\sum_{j=1}^{k} t_{ij} \ln y_j(x_i, \theta) \quad (6)$$

where $\theta$ is the parameter vector, $t_{ij}$ denotes the $i^{th}$ sample belongs to the $j^{th}$ class, and yj(xi,$\theta$) is the output for the $i^{th}$ sample. Once the loss function is formulated, the CNN is trained to find an optimal set of weights that minimizes the loss function. Typically, training requires a large dataset with class labels. After learning an optimal set of weights, the CNN can be deployed as a HIF classifier in practical applications.

As described above, the described embodiment of the apparatus is in the form of an embedded edge device. The dominant challenge for real-time data processing at resource-constrained edge devices is to handle the input data stream with minimized latency and high throughput sufficient to deliver real-time results. For example, delays in processing the incoming data stream can cause data over-writing due to the limited amount of memory in the edge node. Over-writing a data stream before it is processed will result in data loss that can drastically affect the detection accuracy. To avoid these circumstances, high throughput and low latency need to be ensured during data analytics.

Throughput can be defined in two aspects: incoming throughput and outgoing throughput to evaluate performance. Incoming throughput represents the load on the apparatus, and is commonly expressed as samples per second(S/s). Since the current signal is sampled at 20 kHz in the described embodiments, the HIF detection process is expected to analyze 20,000 sample points every second. On the other hand, outgoing throughput is a measure of the rate at which the apparatus can produce results.

Latency can be defined as the amount of time taken to complete an operation. Typically, latency is reported in units of time such as microseconds, milliseconds and seconds. In the context of HIF detection, power line faults need to be detected as rapidly as possible to avoid bushfire hazards, and the protection response time of the described apparatus should be less than 200 milliseconds to reduce fire risk. In addition to that, the HIF detection apparatus demands the deterministic execution of tasks since it is required to respond to HIF events within a given time limit (200 ms in the described embodiments). To address the aforementioned requirements, optimization techniques such as Field Programmable Gate Array (FPGA) based parallelism, pipelined execution of tasks, and timed loop execution using a Real-time Operating System (RTOS) have been implemented in the described embodiments to ensure real-time HIF detection.

FPGA Based True Parallelism

Figure 12:
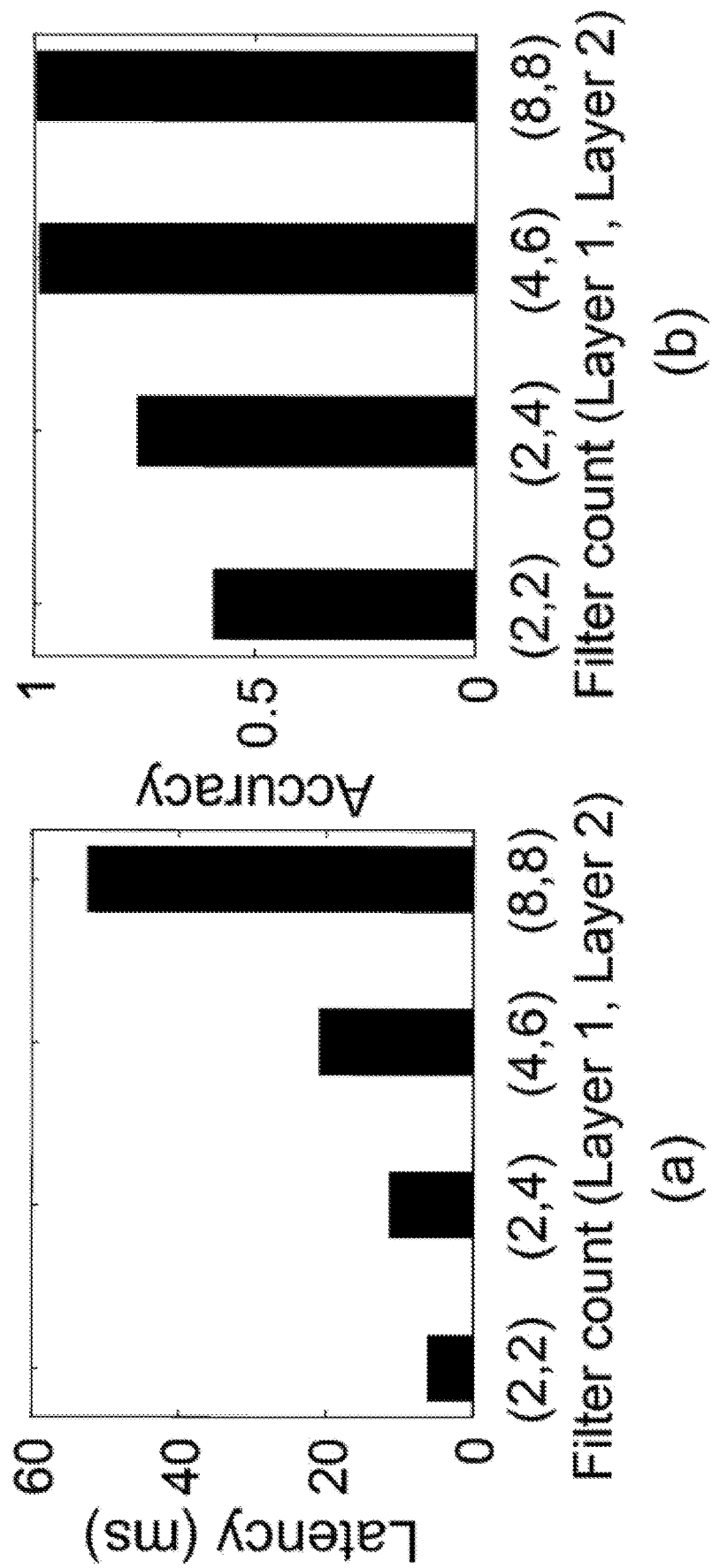
FIG. 12 includes bar charts respectively representing HIF detection latency and HIF detection accuracy resulting from the use of different numbers of convolutional filters in the convolutional layers of the CNN, indicating that the (4,6) combination provides the best balance between latency and accuracy (see text for details)

FPGA-based deployments are well suited for applications with low latency requirements. FPGAs are made of programmable hardware logic blocks along with reconfigurable interconnects. The logic blocks can be programmed to define their functionality. As described above, the described HIF detection process can be partitioned into data acquisition, feature extraction, and fault identification. The data acquisition task needs to be executed every 50 microseconds in order to sample the signal at 20 kHz. Since data acquisition and framing with 50% overlapping requires guaranteed high-speed execution, it is deployed in dedicated FPGA slices. As shown in FIG. 12, the data acquisition and framing tasks continuously push the frame data into an internal (direct memory access, DMA) FIFO buffer which has a limited number of slots. Consequently, these data need to be processed at at least the same rate of sampling in order to avoid buffer overflow in continuous operation. So, the feature calculation logic is implemented on a different section of the FPGA hardware 404, allowing the data acquisition and feature calculation processes to execute in parallel, which also reduces latency and eliminates jitter. The FPGA resource requirements for this implementation are shown in Table 2 below. After extracting each feature, the corresponding raw signal frame is discarded to release storage in the edge device. Only the extracted feature is forwarded to the real-time process.

TABLE 2

FPGA RESOURCE UTILIZATION

| Resource Name | Count (Usage %) |
|---|---|
| Slice Registers | 14413 (40.9%) |
| Slice Look-up tables | 14678 (83.4%) |
| Block RAMs | 20 (33.3%) |
| DSP 48s | 69 (86.2%) |

Pipelining

Figure 13:
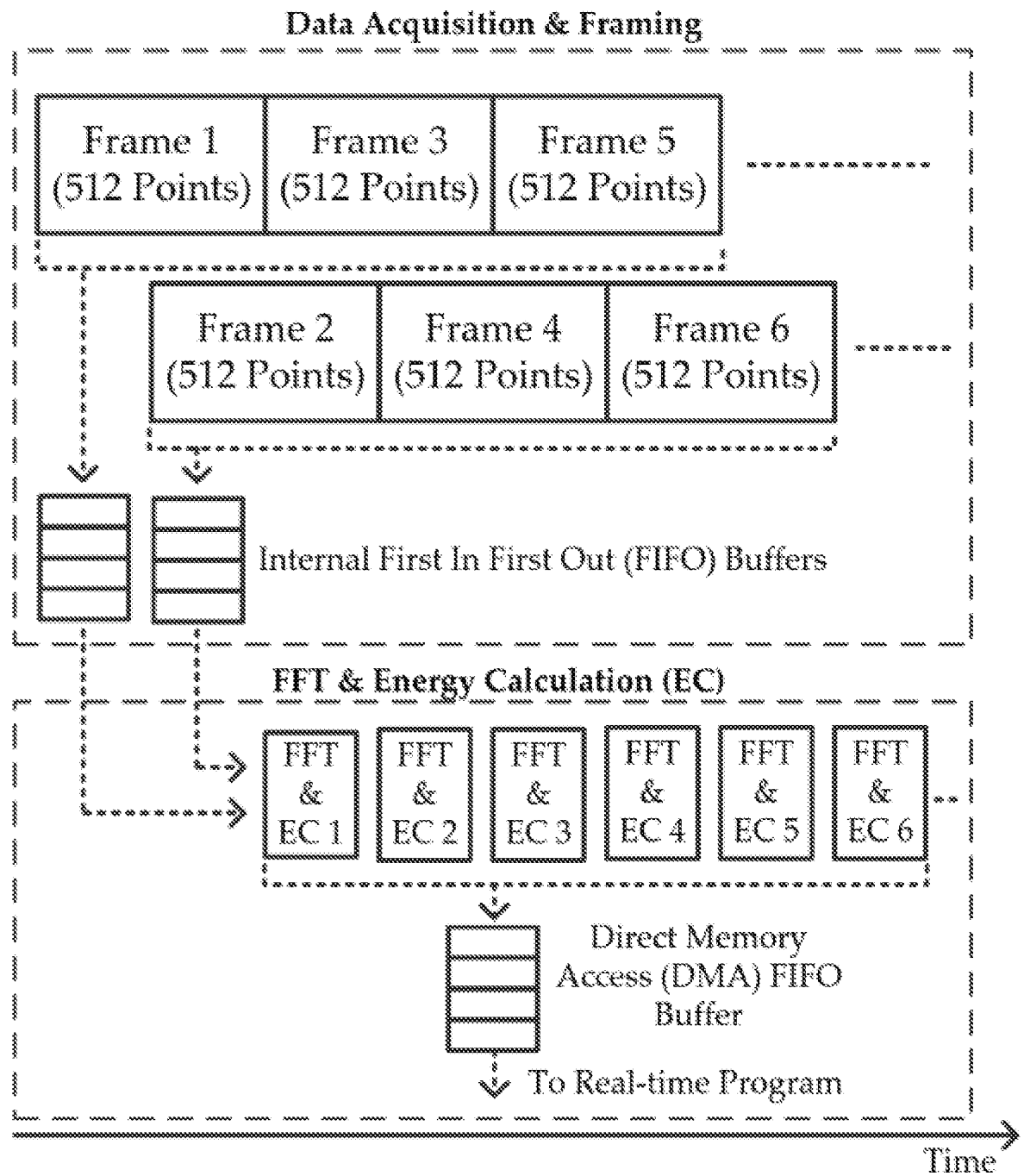
FIG. 13 is a schematic diagram illustrating the division and relative timing of data acquisition and framing, on the one hand, and fast Fourier transform (FFT) and sub-band energy calculations on the other, between different slices of an FPGA of the apparatus to provide true parallel execution between these processes to support real-time operation of the apparatus.

Pipelining improves execution performance by decomposing high latency tasks into several sub-tasks, and allowing them to execute in parallel. FIG. 13 compares the results of sequential execution (FIG. 13(*a*)) and pipelined parallel execution (FIG. 13(*b*)). In the described HIF detection process, 4.48 cycles (89.6 ms) of current signal data is required to generate a feature map for HIF classification. The inventors have determined that this signal acquisition task is the most time-consuming component of the process. Since 4.48 cycles are broken into 6 frames, pipelining can be used to reduce execution time. The feature calculation task can be initiated soon after the first frame of signal acquisition (25.6 ms), rather than waiting for the data acquisition to complete at 89.6 ms. Similarly, once the feature calculation task is executed for the first frame, the feature vector extraction task can be triggered, as shown in FIG. 13 (*b*).

Typically, pipelining is used to improve throughput. Furthermore, most optimizations that improve throughput often negatively affect latency due to the time-sliced operation of multiple sub-tasks in a clock cycle, and the additional data transfers introduced by subtask decompositions. But real-time HIF detection requires low latency as well as high throughput. To accomplish both requirements, the number of pipelined stages is reduced by combining low computationally intensive sub-tasks such as the FFT and sub-band energy calculations into one pipeline stage. In addition, most of the pipeline stages are implemented in dedicated hardware to avoid time-sliced execution, and the data transfer between those stages is facilitated via high-speed DMA FIFOs. Since the HIF classification is based on 6 consecutive feature vectors, the pipelined parallel execution lowers the overall detection latency as well as improving throughput.

Real-Time Operating System

Figure 14:
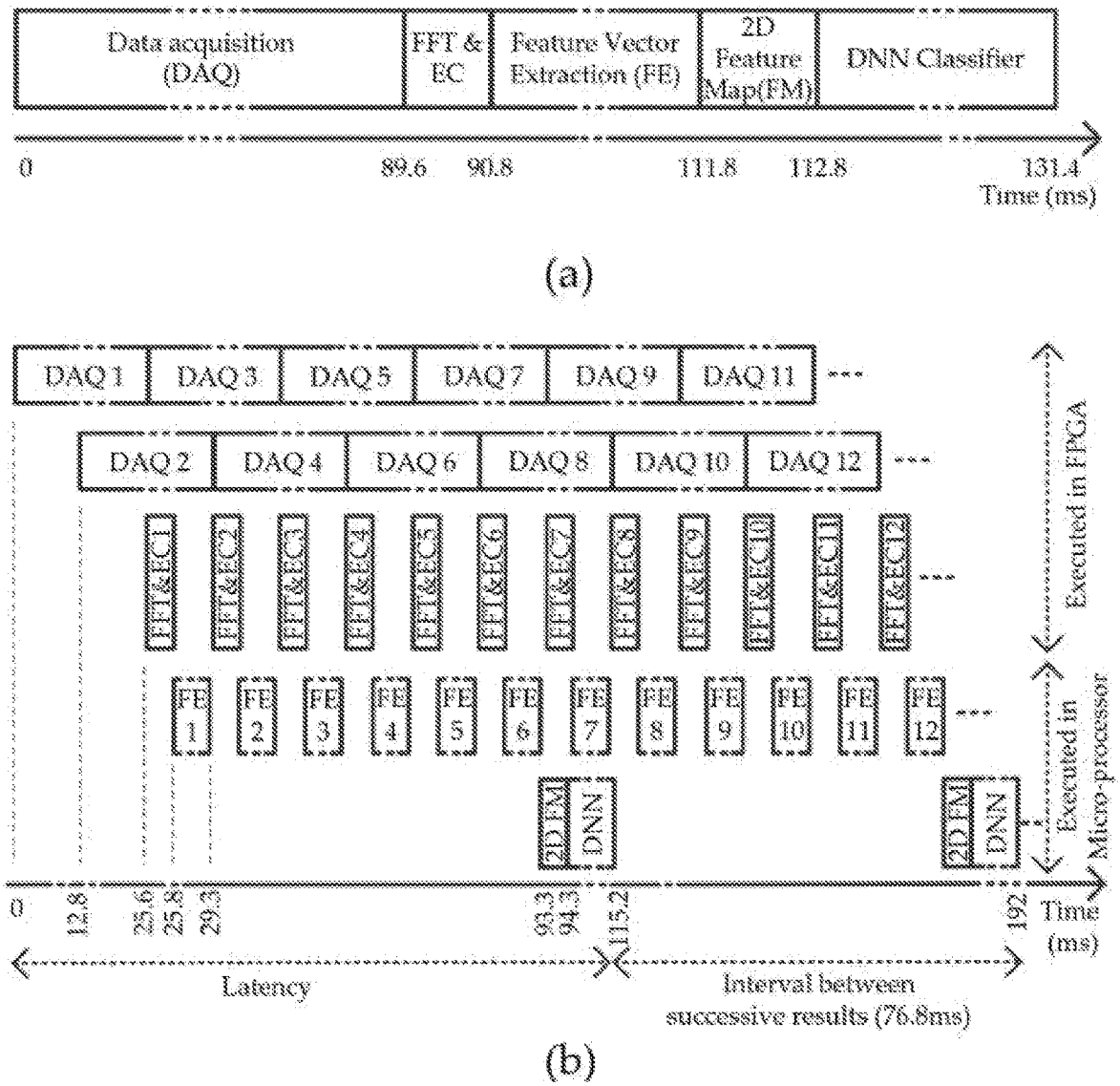
FIG. 14 is a schematic diagram illustrating and comparing (a) conventional sequential execution, and (b) pipelined parallel execution involving the division and timing of the FFT and sub-band energy calculations performed by the FPGA of the apparatus and the concurrent generation of 2D features from the FPGA output performed by a microprocessor of the apparatus to support real-time operation of the apparatus.

A real-time operating system (RTOS) is an operating system that is specially designed to execute tasks with precise timing and high reliability. A RTOS is used in the described embodiments to ensure the timing of HIF detection tasks that are executed by the microprocessor 402. When multiple tasks are executed in the same processor and nominally at the same time, there is a possible variation in latency of each task in each iteration. This latency variation is known as jitter, and primarily results from the contention caused by sharing resources such as processor and memory. The effect of jitter can be clearly observed in general purpose operating systems such as Windows which are designed to ensure fairness across all the running programs. Consequently, they are not able to guarantee execution time and periodicity of a given task. Moreover, the programmer has no control over the task scheduling and prioritization. In contrast, a RTOS allows the programmer to manipulate the execution loop timing, task scheduling, and prioritization based on the application requirements. Jitter can be extremely limited with the optimal choice of loop execution parameters in RTOS. FIG. 14 compares the latency variation between a general purpose OS (Windows PC, HP Elitedesk 800 G1) and the RTOS (NI Linux Real-Time, myRIO-1900) used in the described embodiments. The loop duration, period and priority level can be configured in the timed loop structure provided by the LabVIEW real-time module for RTOS. While choosing the execution parameters, it is essential to ensure that the scheduled loops do not need to compete for processor cycles. This can be ensured via retaining the processor usage well below 100%. A timing budget for each loop is required to estimate the processor usage. The theoretical processor usage can be calculated as follows:

$$ProcessorUsage(\%) = \sum_{k=1}^{N} \frac{LoopDuration}{LoopPeriod} * 100 \qquad (7)$$

Table 3 below lists the timing requirement of each loop of the HIF detection process, resulting in an estimated processor usage of 55.9%. Since the processor 402 is not overloaded, the expected loop execution timing can be guaranteed.

TABLE 3

TIME BUDGET FOR LOOPS

| Loop | Duration (ms) | Period (ms) |
| --- | --- | --- |
| Feature Vector Extraction | 3.5 | 12.8 |
| 2D feature Map | 1 | 76.8 |
| DNN classifier | 20.9 | 76.8 |
| Estimated Processor usage | 55.9% | |

Example

Figure 15:
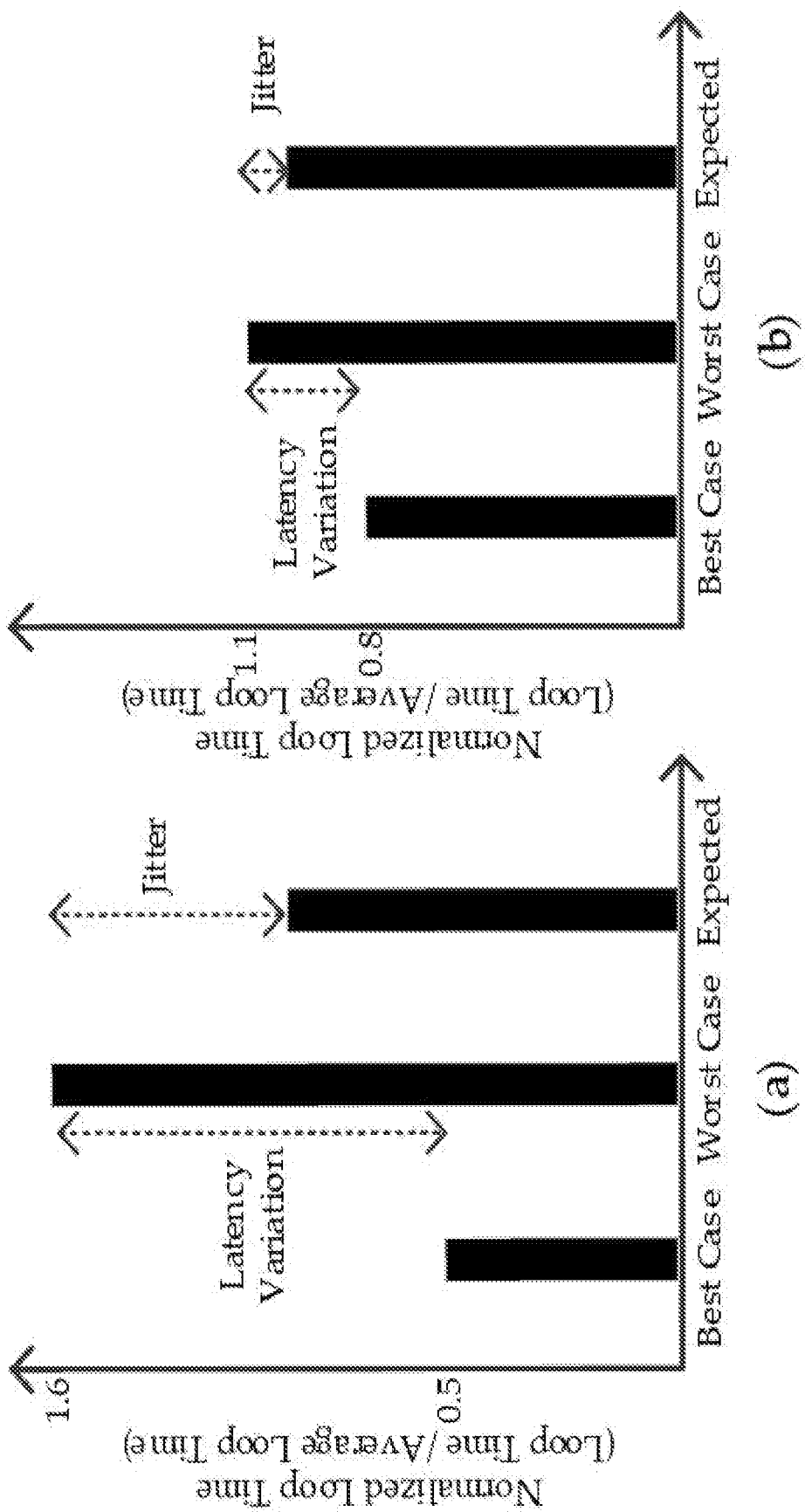
FIG. 15 includes bar charts comparing latency jitter in a general purpose operating system and a real-time operating system: (a) Windows operating system; (b) the NI real-time Linux operating system.
Figure 16:
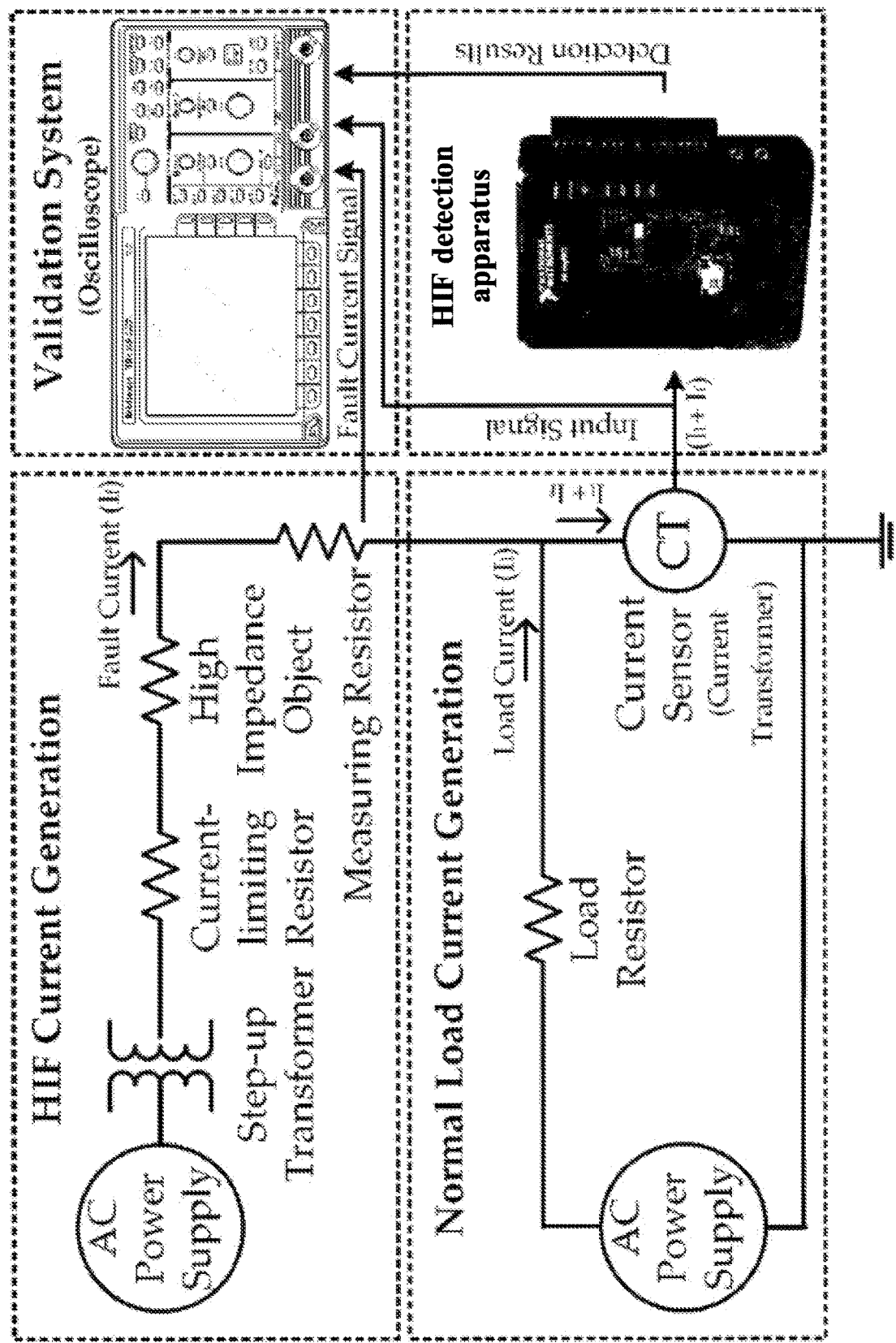
FIG. 16 illustrates a testbed used to evaluate the performance of the HIF detection apparatus and process described herein.

To demonstrate the performance of the HIF detection apparatus and process described herein, an experimental testbed was constructed, as shown in FIG. 15. The testbed includes a 5.55-kVA AC power supply, a 16-kVA step-up transformer with a ratio of 240V/11 kV, a 1-kVA variable voltage transformer, a short length of bare aluminum conductor of 7.5 mm diameter, a 6.25 kΩ current-limiting resistor to protect the transformer, a 47Ω measuring resistor to capture the HIF current, a current sensor (in the form of a current transformer, "CT") to measure the conductor current, a DSO1004A digital oscilloscope, a NI MyRIO-1900 as the edge node, and different high impedance objects (namely, sand, soil, and a tree branch). As described above, HIFs are typically created by a high voltage conductor touching a tree branch or falling to a ground surface composed of sand or soil. The applied voltage was varied from 2 kV to 8 kV, and the HIF current was varied from 0.01 A to 0.2 A, depending on the surface condition of the high impedance object. The normal load current was fixed at 2 A so that the corresponding normal load current to HIF current ratio was higher than 10. Then, three different HIF current signals along with normal load current signals were sampled by the edge device at 20 kHz. The captured signals contained noise from both the sensor and the data acquisition hardware, and were visualized and analyzed using Matlab 2018a.

The same data collection procedure was strictly followed for all experimental conditions, as follows: 1. start the AC power source and adjust the voltage level to create a HIF; 2. start the edge device; 3. capture the current waveform data; 4. turn off the AC power source; 5. change the HIF object and start over.

The feature extraction components 504, 506, 508 and the deep-learning based classifier 510 were validated offline using a dataset with about 60,000 current samples from normal and different HIF conditions, and each current sample corresponded to 4.48 power cycles. The inventors found that the overall detection accuracy of the process can reach 98.67%.

Furthermore, some well-known machine learning techniques such as shallow neural networks (NN) with 1 hidden layer and Support Vector Machines (SVM) were used with the STFT based features for comparison, and it was found that they could only achieve 90.39% and 91.54% accuracy, respectively. In addition to accuracy, several criteria, as shown in equations (8)-(12) below, were used to evaluate the performance of the machine learning algorithms in the context of HIF detection.

$$Accuracy\ (A) = \frac{TP + TN}{TP + TN + FP + FN} \times 100\% \qquad (8)$$

$$Dependability\ (D) = \frac{TP}{TP + FP} \times 100\% \qquad (9)$$

$$Security\ (S) = \frac{TN}{TN + FN} \times 100\% \qquad (10)$$

$$Safety\ (SF) = \frac{TN}{TN + FP} \times 100\% \qquad (11)$$

$$Sensibility\ (SN) = \frac{TP}{TP + FN} \times 100\% \qquad (12)$$

where TP, TN, FP, FN are true positive (correct HIF detections count), true negative (correct healthy condition detections count), false positive (the number of HIFs misclassified as healthy conditions), and false negative (the number of healthy conditions misclassified as HIFs) in the confusion matrix of the classifier, respectively. In addition, Accuracy, Dependability, Security, Safety and Sensibility are measures of overall precision, HIF condition detection precision, normal condition detection precision, hazard prevention level, and system sensitivity related to normal conditions, respectively. The evaluation results are summarized in Table 4 below, and it was concluded that the machine learning process described herein provides better performance than these conventional machine learning techniques for HIF detection.

TABLE 4

HIF DETECTION SYSTEM EVALUATION RESULTS

| Classifier | Accuracy | Dependability | Security | Safety | Sensibility |
|---|---|---|---|---|---|
| SVM | 91.54% | 92.23% | 91.16% | 95.45% | 85.36% |
| NN | 90.39% | 88.18% | 91.69% | 92.95% | 86.19% |
| Proposed CNN | 98.67% | 99.70% | 98.05% | 99.82% | 96.84% |

Real-Time Validation

Figure 17:
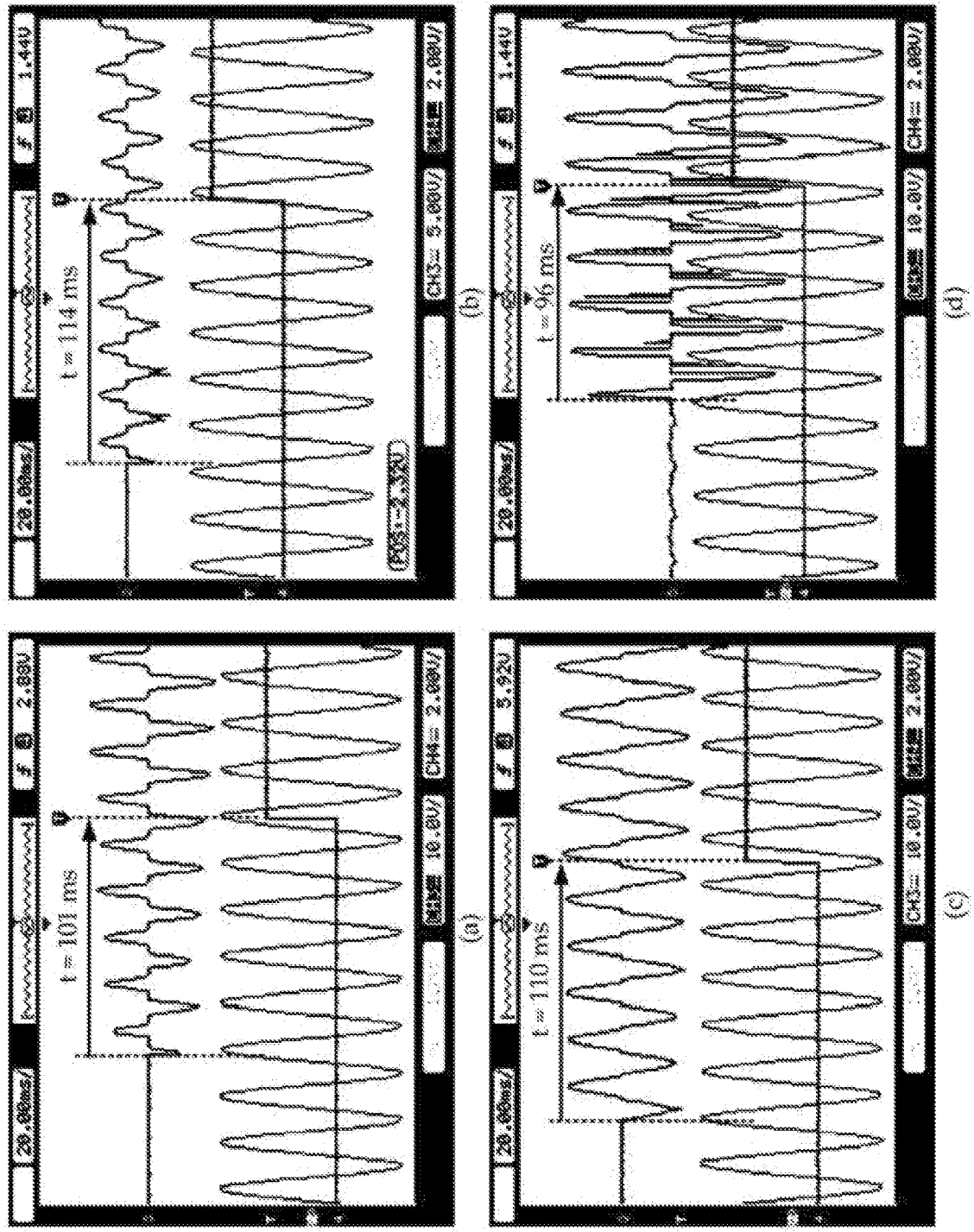
FIG. 17 is a set of screenshots from the testbed oscilloscope, showing real-time HIF detection latency validation for HIFs generated by contact of a power line with: (a) wet sand; (b) dry sand; (c) a tree branch; and (d) soil; each screenshot shows three different signals: 1) the isolated HIF current captured by a 47 Ohm measuring resistor and indicating the start of the fault (upper trace); 2) the measured total current signal (lower trace), and 3) the fault detection signal sent by the HIF detection apparatus (step function overlaid with the lower trace).

The functionality of the described apparatus was validated using an oscilloscope in real-time and the key performance measures are shown in Table 5 below. These validation results confirm that the HIF detection apparatus and process can detect HIFs within 6 power cycles. FIG. 17 visualizes real-time detection results for the three different types of HIFs. During the real-time system validation, no FIFO buffer overflows were detected, confirming that the HIF detection apparatus of the described embodiment can process 20,000 sample points every second without data loss. As the outcome of data processing, it can consistently produce HIF detection results every 76.8 ms (i.e., 13 results/s). Furthermore, the reported utilization of resources such as memory, power and processor confirms the suitability of the described deep learning based HIF detection process for an embedded edge device.

TABLE 5

REAL-TIME VALIDATION RESULTS

| Key Measures | Value |
|---|---|
| Worst case latency | 115.2 ms (<6 cycles) |
| Throughput (incoming) | 20,000 Samples/s |
| Throughput (outgoing) | 13 Detection results/s |
| Maximum memory usage | 156.7/256 MB (61.2%) |
| Worst case power requirement | 14 W |
| Average processor usage | 49% |
| Internal FIFO Overflows | Nil (0) |
| DMA FIFO Overflows | Nil (0) |

Many modifications will be apparent to those skilled in the art without departing from the scope of the present invention.

The invention claimed is:

1. A process for real-time detection of high-impedance faults in power lines, the process including the steps, performed in real-time, of:
   receiving an analog signal representing a real-time electrical current of an electrical power transmission or distribution line as a function of time;
   sampling and digitizing the received analog signal to generate corresponding power line current data representing the electrical current as a function of time;
   processing the power line current data to generate data frames corresponding to respective subsets of the power line current data for respective time slices, and processing each of the data frames to generate corresponding frequency domain data representing frequency components of the electrical current over the corresponding time slice for each of a plurality of respective different frequency ranges;
   processing the frequency domain data to generate energy data representing, for each of the frequency ranges and for each of the time slices, a corresponding average energy of the corresponding frequency components of the electrical current over the corresponding time slice; and
   generating a two-dimensional feature for machine learning, wherein a first dimension of the feature represents a plurality of the time slices, a second dimension of the feature represents the respective different frequency ranges, and each of the values of the two-dimensional feature represents a logarithm of the corresponding average energy of the corresponding frequency components of the electrical current in the corresponding frequency range and over the corresponding time slice;
   applying a deep learning classifier to the two-dimensional feature in order to generate an output to determine whether the two-dimensional feature is indicative of a high-impedance fault in the electrical power transmission or distribution line; and
   if the output of the deep learning classifier is indicative of a high-impedance fault, then sending a fault signal to a corresponding relay or circuit breaker to cause the relay or circuit breaker to cut power to the electrical power transmission or distribution line,
   wherein the deep learning classifier is a lightweight convolutional neural network (CNN) for classifying high impedance faults in real-time on a resource-constrained edge device, the CNN being configured with the following successive layers:
   a first convolution layer with sliding filters;
   a first batch normalization layer;
   a first rectified linear unit (ReLU) activation layer;
   a max pooling 2D layer;
   a second convolution layer with sliding filters;
   a second batch normalization layer;
   a second ReLU activation layer;
   first and second fully connected layers to process feature maps generated by the previous layers; and
   a softmax activation layer to process the fully connected layer output to calculate a probability of the analog signal being indicative of an HIF.

2. The process of claim 1, wherein the step of generating frequency domain data is executed in parallel with the steps of sampling and generating data frames.

3. The process of claim 1, wherein the step of generating frequency domain data and the step of processing the frequency domain data are executed in parallel.

4. The process of claim 1, wherein the received analog signal is sampled at a frequency of at least 20 kHz so that the corresponding frequency domain data represents frequency components up to at least 10 kHz.

5. The process of claim 1, wherein each of the respective different frequency ranges has a corresponding minimum frequency and a corresponding maximum frequency, the maximum frequency being a fixed multiple of the minimum frequency.

6. The process of claim 5, wherein, in each of the respective different frequency ranges, the corresponding maximum frequency is about twice the corresponding minimum frequency.

7. The process of claim 1, wherein the subsets of the power line current data are successive but overlapping subsets of the power line current data for successive but overlapping time slices with about sampled 512 data points, and the data frames are generated by applying a Hann function to each of the subsets of the power line current data.

8. The process of claim 7, wherein each successive pair of time slices overlaps by about 50%.

9. The process of claim 1, wherein a first dimension of the feature represents about six successive but overlapping time slices, and a second dimension of the feature represents about eight different frequency ranges.

10. The process of claim 1, wherein each convolution layer applies a convolution operation by moving the filters along the layer's input vertically and horizontally by a step size or 'stride' (S), and calculating a dot product of weights (W) and the layer's input (I), and then adding a bias (B) term, according to:

$$O[f][x][y] = \sum_{k=0}^{C-1} \sum_{i=0}^{X-1} \sum_{j=0}^{Y-1} I[k][S*x+i][S*y+j] \times W[f][k][i][j] + B(f)$$

where O, f, C, X and Y respectively denote the output matrix, the number of filter groups in a convolutional layer, the number of channels in the input, the filter height and the filter width.

11. The process of claim 1, wherein each batch normalization layer normalizes its input as mini-batches according to:

$$y_i = \gamma \left( \frac{x_i - \mu_B}{\sqrt{\sigma_B^2 + \varepsilon}} \right) + \beta$$

where $x_i$, $\mu_B$, $\sigma B^2$, $\gamma$, and $\beta$ are input, mini-batch mean, mini-batch variance, scale factor and offset, and $\varepsilon$ is introduced to improve numerical stability as mini-batch variance approaches 0.

12. The process of claim 1, wherein the CNN is trained to determine a set of weights using a cross entropy loss function of the form:

$$E(\theta) = -\sum_{i=1}^{n} \sum_{j=1}^{k} t_{ij} \ln y_j(x_j, \theta)$$

where $\theta$ is a parameter vector, $t_{ij}$ denotes the $i^{th}$ sample belongs to the $j^{th}$ class, and $y_j(x_i,\theta)$ is the output for the $j^{th}$ sample.

13. A non-volatile storage medium having stored thereon FPGA configuration data and/or processor executable instructions that, when executed by at least one processor, cause the at least one processor and/or an FPGA configured in accordance with the FPGA configuration data to execute the steps of claim 1.

14. An apparatus for real-time detection of high-impedance faults in power lines, the apparatus including:
an input to receive an analog signal representing a real-time electrical current of an electrical power transmission or distribution line as a function of time;
a memory component; and
at least one non-volatile memory component storing FPGA configuration data to configure the FPGA;
a field-programmable gate array (FPGA) component that, when configured in accordance with the configuration data, causes the FPGA to:
sample and digitize the received analog signal to generate corresponding power line current data representing the electrical current as a function of time;
select successive subsets of the power line current data; and
process the power line current data to generate data frames representing successive subsets of the power line current data for respective successive time slices, and processing each of the data frames to generate corresponding frequency domain data representing frequency components of the electrical current over the corresponding time slice for each of a plurality of respective different frequency ranges;
wherein the non-volatile memory component stores processor-executable instructions that, when executed by the microprocessor cause it to:
process the frequency domain data to generate energy data representing, for each of the frequency ranges and for each of the time slices, a corresponding average energy of the corresponding frequency components of the electrical current over the corresponding time slice; and
generate a two-dimensional feature for machine learning, wherein a first dimension of the feature represents a plurality of the time slices, a second dimension of the feature represents the respective different frequency ranges, and each of the values of the two-dimensional feature represents a logarithm of the corresponding average energy of the corresponding frequency components of the electrical current in the corresponding frequency range and over the corresponding time slices; and
apply a deep learning classifier to the two-dimensional feature in order to generate an output to determine whether the two-dimensional feature is indicative of a high-impedance fault in the electrical power transmission or distribution line; and
if the output of the deep learning classifier is indicative of a high-impedance fault, then send a fault signal to a corresponding relay or circuit breaker to cause the relay or circuit breaker to cut power to the electrical power transmission or distribution line,
wherein the deep learning classifier is a lightweight convolutional neural network (CNN) for classifying high impedance faults in real-time on a resource-constrained edge device, the CNN being configured with the following successive layers:
a first convolution layer with sliding filters;
a first batch normalization layer;
a first rectified linear unit (ReLU) activation layer;
a max pooling 2D layer;
a second convolution layer with sliding filters;
a second batch normalization layer;
a second ReLU activation layer;
first and second fully connected layers to process feature maps generated by the previous layers; and
a softmax activation layer to process the fully connected layer output to calculate a probability of the analog signal being indicative of an HIF.

15. The apparatus of claim 14, wherein the FPGA is configured such that the steps of sampling and selecting are executed by a first slice of the FPGA, and the step of generating frequency domain data is performed by a second slice of the FPGA different to the first slice, the first and second slices operating concurrently.

16. The apparatus of claim 14, wherein the FPGA and microprocessor are configured for pipelined parallel execution of the steps of generating frequency domain data and processing the frequency domain data.

17. The apparatus of claim 14, wherein the apparatus is in the form of an embedded device attached to a power line support pole and operating as an edge computing device.

\* \* \* \* \*